(12) United States Patent
Agrawal et al.

(10) Patent No.: US 6,523,162 B1
(45) Date of Patent: Feb. 18, 2003

(54) GENERAL PURPOSE SHAPE-BASED LAYOUT PROCESSING SCHEME FOR IC LAYOUT MODIFICATIONS

(75) Inventors: Deepak Agrawal, Milpitas, CA (US); Fang-Cheng Chang, Sunnyvale, CA (US); Hyungjip Kim, Seoul (KR); Yao-Ting Wang, Sunnyvale, CA (US); Myunghoon Yoon, Sunnyvale, CA (US)

(73) Assignee: Numerical Technologies, Inc., San Jose, CA (US)

( * ) Notice: Subject to any disclaimer, the term of this patent is extended or adjusted under 35 U.S.C. 154(b) by 153 days.

(21) Appl. No.: 09/632,080

(22) Filed: Aug. 2, 2000

(51) Int. Cl.[7] .............................................. G06F 17/50
(52) U.S. Cl. .......................................... 716/19; 716/11
(58) Field of Search ............................... 716/19–21, 11; 430/22, 30

(56) References Cited

U.S. PATENT DOCUMENTS

| 4,231,811 A | 11/1980 | Somekh et al. ............... 148/1.5 |
| 4,426,584 A | 1/1984 | Bohlen et al. ............ 250/492.2 |

(List continued on next page.)

FOREIGN PATENT DOCUMENTS

| GB | 2324169 A | 10/1998 |
| GB | 2344436 A | 7/2000 |
| JP | 3-80525 | 4/1991 |
| JP | 3-210560 | 9/1991 |
| JP | 8-236317 | 9/1996 |
| JP | 10-133356 | 5/1998 |
| JP | 11-143085 | 5/1999 |
| WO | WO 99/47981 | 9/1999 |

OTHER PUBLICATIONS

Chuang et al.; "Practical Applications Of 2–D Optical Proximity Corrections For Enhanced Performance Of 0.25um Random Logic Devices"; 1997 IEEE; pp. 18.7.1–18.7.4.

Yen et al., Optical Proximity Correction For 0.3 um I–Line Lithography; Microelectronic Engineering 30 (1996); pp. 141–144.

(List continued on next page.)

*Primary Examiner*—Matthew Smith
*Assistant Examiner*—Paul Dinh
(74) *Attorney, Agent, or Firm*—Bever, Hoffman & Harms, LLP; Erik L. Oliver; Jeanette S. Harms

(57) ABSTRACT

Layout processing can be applied to an integrated circuit (IC) layout using a shape-based system. A shape can be defined by a set of associated edges in a specified configuration. A catalog of shapes is defined and layout processing actions are associated with the various shapes. Each layout processing action applies a specified layout modification to its associated shape. A shape-based rule system advantageously enables efficient formulation and precise application of layout modifications. Shapes/actions can be provided as defaults, can be retrieved from a remote source, or can be defined by the user. The layout processing actions can be compiled in a bias table. The bias table can include both rule-based and model-based actions, and can also include single-edge shapes for completeness. The scanning of the IC layout can be performed in order of increasing or decreasing complexity, or can be specified by the user. The appropriate layout processing actions are applied to matching portions of the IC layout to form the corrected photomask layout. This process can be sequential or batch mode. Shape and action conflicts can be resolved by marking identified/modified elements or by designing rules for orderly resolution of any inconsistencies or overlaps.

54 Claims, 15 Drawing Sheets

U.S. PATENT DOCUMENTS

| | | | |
|---|---|---|---|
| 4,456,371 A | 6/1984 | Lin | 355/71 |
| 4,812,962 A | 3/1989 | Witt | 364/490 |
| 4,895,780 A | 1/1990 | Nissan-Cohen et al. | 430/5 |
| 4,902,899 A | 2/1990 | Lin et al. | 250/492.1 |
| 5,051,598 A | 9/1991 | Ashton et al. | 250/492.2 |
| 5,182,718 A | 1/1993 | Harafuji et al. | 364/490 |
| 5,208,124 A | 5/1993 | Sporon-Fiedler et al. | 430/5 |
| 5,241,185 A | 8/1993 | Meiri et al. | 250/492.2 |
| 5,242,770 A | 9/1993 | Chen et al. | 430/5 |
| 5,256,505 A | 10/1993 | Chen et al. | 430/5 |
| 5,340,700 A | 8/1994 | Chen et al. | 430/312 |
| 5,447,810 A | 9/1995 | Chen et al. | 430/5 |
| 5,498,579 A | 3/1996 | Borodovsky et al. | 437/250 |
| 5,553,273 A | 9/1996 | Liebmann | 395/500 |
| 5,553,274 A | 9/1996 | Liebmann | 395/500 |
| 5,631,110 A | 5/1997 | Shioiri et al. | 430/5 |
| 5,636,002 A | 6/1997 | Garofalo | 355/53 |
| 5,657,235 A | 8/1997 | Liebmann et al. | 364/474.24 |
| 5,663,017 A | 9/1997 | Schinella et al. | 430/5 |
| 5,663,893 A | 9/1997 | Wampler et al. | 364/491 |
| 5,682,323 A | 10/1997 | Pasch et al. | 364/491 |
| 5,705,301 A | 1/1998 | Garza et al. | 430/5 |
| 5,707,765 A | 1/1998 | Chen | 430/5 |
| 5,723,233 A | 3/1998 | Garza et al. | 430/5 |
| 5,740,068 A | 4/1998 | Liebmann et al. | 364/489 |
| 5,766,806 A | 6/1998 | Spence | 430/5 |
| 5,815,685 A | 9/1998 | Kamon | 395/500 |
| 5,821,014 A | 10/1998 | Chen et al. | 430/5 |
| 5,825,647 A | 10/1998 | Tsudaka | 364/167.03 |
| 5,827,623 A | 10/1998 | Ishida et al. | 430/5 |
| 5,847,959 A | 12/1998 | Veneklasen et al. | 364/468.28 |
| 5,862,058 A | 1/1999 | Samuels et al. | 364/491 |
| 5,863,682 A | 1/1999 | Abe et al. | 430/30 |
| 5,879,844 A | 3/1999 | Yamamoto et al. | 430/30 |
| 5,885,734 A | 3/1999 | Pierrat et al. | 430/5 |
| 5,900,338 A | 5/1999 | Garza et al. | 430/5 |
| 5,900,340 A * | 5/1999 | Reich et al. | 430/22 |
| 5,920,487 A * | 7/1999 | Reich et al. | 327/517 |
| 5,958,635 A | 9/1999 | Reich et al. | 430/30 |
| 5,972,541 A | 10/1999 | Sugasawara et al. | 430/5 |
| 5,994,002 A | 11/1999 | Matsuoka | 430/5 |
| 6,007,310 A | 12/1999 | Jacobsen et al. | 417/362 |
| 6,077,310 A * | 6/2000 | Yamamoto et al. | 430/30 |
| 6,078,738 A | 6/2000 | Garza et al. | 395/500.22 |
| 6,081,658 A | 6/2000 | Rieger et al. | 395/500.22 |
| 6,114,071 A | 9/2000 | Chen et al. | 430/5 |
| 6,171,731 B1 * | 1/2001 | Medvedeva et al. | 430/5 |
| 6,249,597 B1 | 6/2001 | Tsudaka | 382/144 |
| 6,269,472 B1 | 7/2001 | Garza et al. | |
| 6,289,499 B1 | 9/2001 | Rieger et al. | 716/21 |
| 6,370,679 B1 | 4/2002 | Chang et al. | |

OTHER PUBLICATIONS

Choi, Y., et al., "Optical Proximity Correction on Attenuated Phase Shifting Photo Mask for Dense Contact Array", LG Semicon Company (11 pages).

Lucas, K., et al., "Model Based OPC for 1st Generation 193nm Lithography", Motorola Inc., IDT assignee to IMEC (12 pages).

Stimiman, J., et al., "Quantifying Proximity and Related Effects in Advanced Wafer Processes", Precim Company, Hewlett Packard Labs (9 pages).

Sugawara, M., et al., "Practical Evaluation of Optical Proximity Effect Correction by EDM Methodology", Sony Corporation (11 pages).

Granik, Y., et al., "MEEF as a Matrix", Mentor Graphics Corporation (11 pages).

Kang, D., et al., "Effects of Mask Bias on t he Mask Error Enhancement Factor (MEEF) of Contact Holes" (11 pages).

Matsuura, S., et al., "Reduction of Mask Error Enhancement Factor (MEEF) by the Optimum Exposure Dose Self–Adjusted Mask", NEC Corporation (12 pages).

Fu, C.C., et al., "Enhancement of Lithographic Patterns by Using Self Features", IEEE, Transactions On Electron Devices, vol. 38, No. 12, pp. 2599–2603, Dec. 1991.

Henderson, R., et al., "Optical Proximity Effect Correction: An Emerging Technology", Microlithography World, pp. 6–12 (1994).

Karklin, L., "A Comprehensive Simulation Study of the Photomask Defects Printability", SPIE, vol. 2621, pp. 490–504 (1995).

Dolainsky, C., et al., "Application of a Simple Resist Model to Fast Optical Proximity Correction", SPIE, vol. 3051, pp. 774–780 (1997).

Chen, J., et al., "Full–Chip Optical Proximity Correction with Depth of Focus Enhancement", Microlithography World ,(5 pages) (1997).

Wong, A., et al., "Lithographic Effects of Mask Critical Dimension Error", SPIE, vol. 3334, pp. 106–115 (1998).

Balasinski, A., et al., "Comparison of Mask Writing Tools and Mask Simulations for 0.4um Devices", IEEE, SEMI Advanced Semiconductor Manufacturing Conference, pp. 372–377 (1999).

Ackmann, P. et al., "Phase Shifting And Optical Proximity Corrections To Improve CD Control On Logic Devices In Manufacturing For Sub 0.35 γm I–Line", Advance Micro Devices (8 pages).

Asai, N. et al., "Proposal For The Coma Aberration Dependent Overlay Error Compensation Technology", *Jpn. J. Appl. Phys.*, vol. 37, pp. 6718–6722 (1998).

Barouch, E. et al., "Optimask: An OPC Algorithm For Chrome And Phase–Shift Mask Design", *SPIE*, vol. 2440, pp. 192–206, Feb. 1995.

Chen, J.F. et al., "Full–Chip Proximity Correction With Depth Of Focus Enhancement", *Microlithography World* (1997).

Chen, J.F. et al., "Optical Proximity Correction For Intermediate–Pitch Features Using Sub–Resolution Scattering Bars", MicroUnity Systems Engineering, Inc., Sunnyvale, California, pp. 1–16.

Chen, J.F., et al., "Practical Method For Full–Chip Optical Proximity Correction", MicroUnity Systems Engineering, Inc., Sunnyvale, California (14 pages).

Cobb, et al., "Fast Sparse Aerial Image Calculation For OPC", *SPIE*, vol. 2621, pp. 534–544.

Garofalo, J. et al., "Automated Layout Of Mask Assist–Features For Realizing $0.5k_1$ ASIC Lithography", *SPIE*, vol. 2440, pp. 302–312 (1995).

Garofalo, J. et al., "Automatic Proximity Correction For 0.35 γm I–Line Photolithography", *IEEE*, pp. 92–94 (1994).

Garofalo, J. et al., "Mask Assisted Off–Axis Illumination Technique For Random Logic", *J. Vac. Sci. Technol. B*, vol. 11, No. 6, pp. 2651–2658, Nov./Dec. 1993.

Gotoh, Y. et al., "Pattern Dependent Alignment Technique For Mix–And–Match Electron–Beam Lithography With Optical Lithography", *J. Vas. Sci. Technol. B*, vol. 16, No. 6, pp. 3202–3205, Nov./Dec. 1998.

Harafuju, K. et al., "A Novel Hierarchical Approach For Proximity Effect Correction In Electron Beam Lithography", *IEEE*, vol. 12, No. 10, pp. 1508–1514, Oct. 1993.

Lin, B.J., "Methods To Print Optical Images At Low–$k_1$ Factors", *SPIE*, Optical/Laser Microlithography III, vol. 1264, pp. 2–13 (1990).

Lithas, "Lithas: Optical Proximity Correction Software" (2 pages).

Microunity, "OPC Technology & Product Description", MicroUnity Systems Engineering, Inc., pp. 1–5.

Morimoto, H., et al., "Next Generation Mask Strategy—Technologies Are Ready For Mass Production Of 256MDRAM?", *SPIE*, vol. 3236, pp. 188–189 (1997).

Park, C. et al., "An Automatic Gate CD Control For A Full Chip Scale SRAM Device", *SPIE*, vol. 3236, pp. 350–357 (1997).

Pierrat, C. et al., "A Rule–Based Approach To E–Beam And Process–Induced Proximity Effect Correction For Phase–Shifting Mask Fabrication", *SPIE*, vol. 2194, pp. 298–309 (1994).

Precim, "Proxima System", Precim Company, Portland, Oregon (2 pages).

Precim, "Proxima Wafer Correction System", Precim Company, Portland, Oregon (2 pages).

Rieger, M. et al., "Customizing Proximity Correction For Process–Specific Objectives", *SPIE*, vol. 2726, pp. 651–659 (1996).

Rieger, M. et al., "Mask Fabrication Rules For Proximity––Corrected Patterns", Precim Company, Portland, Oregon (10 pages).

Rieger, M. et al., "System For Lithography Proximity Compensation", Precim Company, Portland, Oregon, Sep. 1993 (28 pages).

Rieger, M. et al., "Using Behavior Modeling For Proximity Correction", Precim Company, Portland, Oregon (6 pages).

Saleh, B. et al., "Reduction Of Errors Of Microphotographic Reproductions By Optimal Corrections Of Original Masks", *Optical Engineering*, Vo. 20, No. 5, pp. 781–784, Sep./Oct. 1981.

Spence, C. et al., "Automated Determination Of CAD Layout Failures Through Focus: Experiment And Simulation", *SPIE*, vol. 2197, pp. 302–313 (1994).

Spence, C. et al., "Integration Of Optical Proximity Correction Strategies In Strong Phase Shifters Design For Poly–Gate Layers", *Bacus News*, vol. 15, Issue 12, pp. 1, 4–13, Dec. 1999.

Stirniman, J. et al., "Fast Proximity Correction With Zonee Sampling", *SPIE*, vol. 2197, pp. 294–301 (1994).

Stirniman, J. et al., "Optimizing Proximity Correction For Wafer Fabrication Processes", *SPIE*, Photomask Technology and Management, vol. 2322, pp. 239–246 (1994).

Stirniman, J. et al., "Wafer Proximity Correction And Its Impact On Mask–Making", *Bacus News*, vol. 10, Issue 1, pp. 1, 3–7, 10–12, Jan. 1994.

Trans Vector, "Now Better Quality Photomasks", Trans Vector Technologies, Inc., Camarillo, California (4 pages).

Yen, A. et al., "Characterization And Correction Of Optical Proximity Effects In Deep–Ultraviolet Lithography Using Behavior Modeling", *J. Vac. Sci. Technol. B*, vol. 14, No. 6, pp. 4175–4178, Nov./Dec. 1996.

* cited by examiner

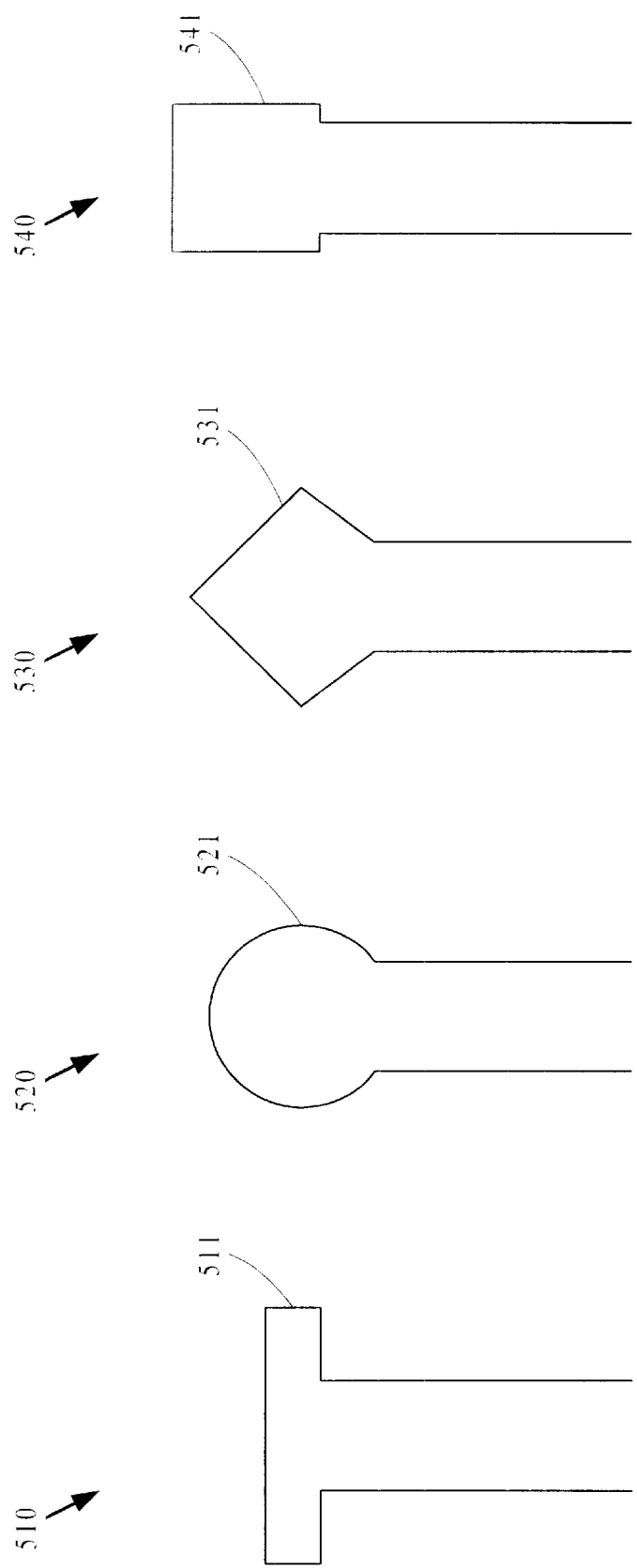

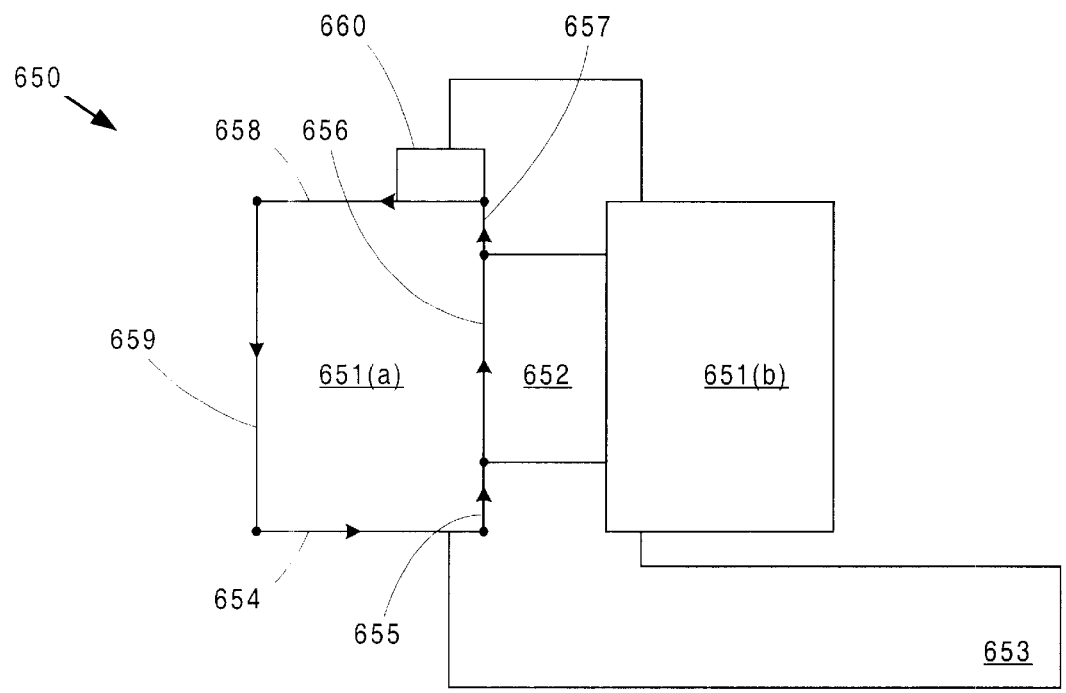
Fig. 6c
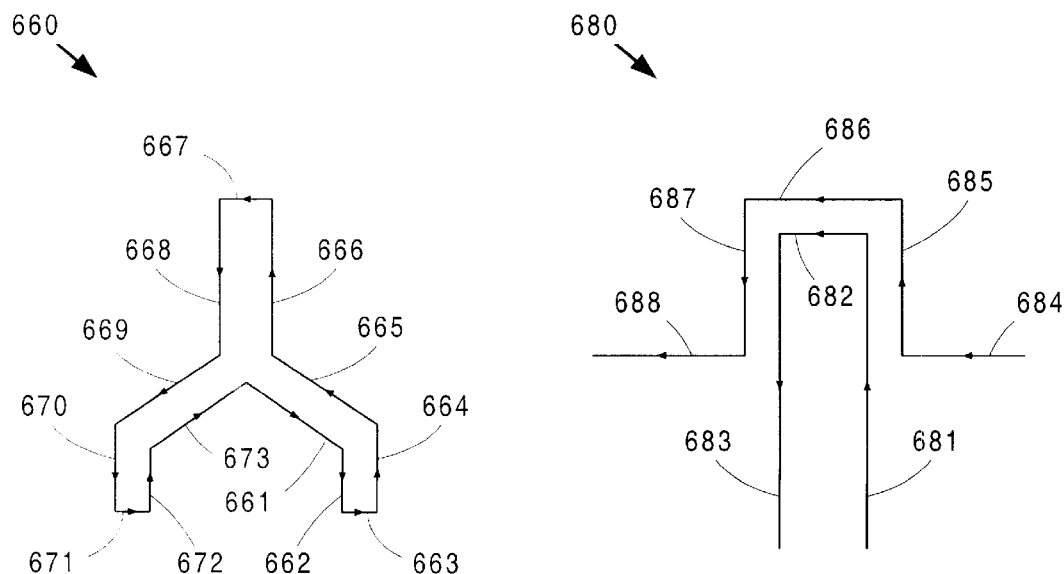
Fig. 6d
Fig. 6e

1200

GENERAL PURPOSE SHAPE-BASED LAYOUT PROCESSING SCHEME FOR IC LAYOUT MODIFICATIONS

FIELD OF THE INVENTION

The invention relates to the field of photolithography, and more particularly to a system for applying modifications to an IC layout.

BACKGROUND OF THE INVENTION

Photomasks are used in the production of integrated circuits (ICs) to transfer a circuit layout ("IC layout") onto a receiving substrate, such as a silicon wafer. A photomask is typically a glass plate covered by a thin chrome layer, in which a portion of the IC layout is etched. A source of light or radiation is used to expose this photomask pattern ("photomask layout") onto, a layer of photosensitive resist on the surface of the wafer. The top surface of the wafer is then chemically etched away in the areas not covered by the photoresist, thereby completing the transfer of the original IC layout onto the wafer. This transference process is known as photolithography.

Photolithography is a critical step in the IC manufacturing process. The accuracy of the pattern formed on the wafer ("printed image") significantly affects both process yield and IC performance. However, reliably resolving modern IC geometries in the 0.25-μm range and smaller using existing photolithography equipment is difficult. At such reduced feature sizes, optical distortion impedes exact transfer of the photomask pattern onto the wafer.

To counteract any unwanted deviations, a technique known as optical proximity correction (OPC) has been developed. OPC involves modification of the original IC layout to compensate for distortions introduced by the exposure process. The modification involves changing the dimensions of affected features or incorporating corrective features into the photomask pattern. For example, diffractive effects around small features in a photomask pattern can cause corner rounding in the printed image. FIG. 1a shows a sharp corner 100 that would typically be present in an original photomask pattern, and a rounded corner 110 that would appear in the actual printed image without OPC. FIG. 1b shows a corner 120 in a photomask pattern that has been modified using OPC to include an extra feature called a serif. The serif is sized such that the printed image corner 130 produced by photomask corner 120 has the desired form. Other OPC features (hammerheads, scattering bars, assist features, etc.) are well known in the art. These modifications to the original IC layout may sometimes be referred to generically as "biases" or "bias features".

There are two methods for determining the appropriate biases to add to an IC layout: model-based OPC and rule-based OPC. Model-based OPC applies corrections to the IC layout and uses models of the photolithography processes to determine the most effective biases. By essentially simulating an actual photolithography step and converging on a solution, model-based OPC can provide a thorough and detailed set of biases to apply to the original layout. However, this technique is extremely computation-intensive due to the iterative nature of the process. Also, the accuracy of the final output is only as good as the models used in the calculations.

In contrast, rule-based OPC applies a set of geometry-based rules to the original IC layout. The rules are specified by the user, and define the biases to be incorporated in the photomask layout. Conventional rule-based OPC systems base the application of OPC biases on the geometries of edges within the original IC layout.

Although the complex patterns of an IC layout may seem to be made up of fine lines, even the thinnest of lines are actually 2-dimensional elements. As such, they can be represented by a series of contiguous edges, joined to other edges at distinct vertices. Conventional rule-based OPC systems evaluate each edge of the original IC layout and apply biases to those edges according to pre-specified rules. The rules are typically based upon the length of an edge and its spacing from other edges.

FIG. 2a shows a layout feature 200a, sometimes referred to as a "finger", which is common in IC layouts. OPC modifications must often be applied to finger features to create photomask layouts that properly transfer the original feature during photolithography. Feature 200a comprises edges 221, 222, 223, 224, and 225. The directions of edges 221–225 are as shown, and the inner sides of edges 221–225 are on the left.

FIG. 2b shows a printed image 200b that represents the printed image produced by a photolithography step using unmodified feature 200a in a photomask pattern. Printed image 200b shows undesirable corner rounding and shortening in region 230. To compensate for such distortion, various OPC modifications can be incorporated into the photomask layout, depending on the specific dimensions of feature 200a and its relationship to the rest of the IC layout. FIG. 2c shows a modified feature 200c, which includes a hammerhead 240 to correct for the distortions shown in FIG. 2b. FIG. 2d shows an alternative modified feature 200d, which includes serifs 250 as a corrective mechanism.

Determination of the appropriate OPC correction is made through the use of a bias table. Created prior to performing the OPC operation, the bias table defines the rules to be applied, each of which is a function of the edge properties. The bias table is typically structured as a look-up table, such as shown in Table 1.

TABLE 1

Edge-Based Bias Table

| L (μm) | d (μm) | BIAS |
|---|---|---|
| <0.25 | >1.5 | Hammerhead |
| 0.5 ± .05 | 1.0 ± 0.5 | Serifs |

Table 1 includes sample values for rules that would be applied to edge 223 of FIG. 2a to create OPC features 240 and 250, shown in FIGS. 2c and 2d, respectively. In Table 1, "L" represents the length of edge 223, and d represents the minimum spacing between edges (i.e., the distance between edge 223 and edges 221 and 225). As indicated by the values in Table 1, if feature 200a is tall and thin (i.e., less than 0.25 μm wide and greater than 1.5 μm tall), then a hammerhead feature will be applied. However, if feature 200a is more squat (i.e., 0.5 μm wide and 1.0 μm tall), serifs will be added. Of course, the bias table would contain additional sizing and placement information for the varios biases.

Because a simple lookup table can be used, rule-based OPC is much more computationally efficient than model-based OPC. However, the current edge-based systems may be too limited to effectively provide corrections for complex layouts. For example, it may be desirable to apply (or not apply) different OPC modifications to edges that have similar properties. FIG. 2e shows a feature 200e that includes an edge 263. Edge 263 may have the same length and spacing as edge 223 in FIG. 2a, but it may be desirable to apply OPC correction to only one of the two features. For example, feature 200a may be a non-critical feature that can tolerate substantial distortion, while feature 200e must be accurately transferred for proper IC function. If feature 200a was prevalent throughout the IC layout, it would be preferable to avoid complicating the final photomask layout by adding unnecessary OPC modifications. However, an edge-based system using a single edge is not able to readily make a distinction between edges 223 and 263, and therefore would not be able to apply different OPC modifications to features 200a and 200e.

Accordingly, it would be desirable to provide a system that enables greater flexibility and control in applying layout modifications.

SUMMARY OF THE INVENTION

Embodiments of the invention provide a system for applying layout processing to an IC layout (a portion of the layout or the entire layout) using a shape-based identification system. A shape can be defined as a set of associated edges. Therefore, a shape can provide much greater specificity than a single edge in identifying layout features of interest. A catalog of shapes can be defined and layout processing actions can be formulated based on the properties of the various shapes. Shapes can include various contiguous edge profiles, such as fingers, hammerheads, diamond hammerheads, fuzzy hammerheads, and tombstones, among others. Shapes can also include non-contiguous edge combinations, edges from multiple layers of an IC layout, and edges with specific properties. Properties inherent in a particular edge can include length, inner color, and outer color, among others. Other properties associated with an edge can include spacing, beginning angle, and ending angle, among others.

While length and spacing are relatively self-explanatory, other edge properties such as inner/outer color and beginning/ending angle cannot be easily defined without understanding the concept of direction. Direction is a convention used to define the inner and outer sides of an edge. Because all edges are part of a closed form, one side of the edge will always be within the form (inner side), while the other side will always be outside the form (outer side). Therefore, direction can be defined by stating that when travelling from the beginning to the end of the edge, the inner side will always be to the left. Of course, the inner side could just as well be defined to be always to the right. The closed nature of the forms also means that each edge is joined to another edge at its beginning and its end. These junctions are defined as vertices, or corners. Each vertex represents a meeting of two edges at a specific angle. The beginning angle is the angle between the inner sides of the edges meeting at the vertex at the beginning of the edge. Similarly, the ending angle is the angle between the inner sides of the edges meeting at the vertex at the end of the edge. Finally, color is simply another convention used to identify the nature of the shape on the inner or outer side of the edge. Colors can be specified for various device or interconnect components, to enable more appropriate OPC rule application (e.g., edges forming a gate may be blue, while edges forming a diffusion region may be red).

The library of layout processing actions associated with the shapes can be rule-based, model-based, or can provide any other response a user would like implemented (i.e., "layout processing" can include OPC, phase shift mask (PSM), design rule checking (DRC), "fracturing" of layout features for e-beam mask making machines, etc.). Specific features can be much more simply, efficiently, and flexibly identified by a single multi-edge structure than by a single edge with multiple relational variables. Therefore, a shape-based feature identification system advantageously enables efficient application of layout processing actions having a high degree of specificity.

In some embodiments of the invention, the library of layout processing actions can be compiled in a bias table in an accessible format, such as a look up table. The IC layout is scanned, and whenever a shape match is detected, the associated action(s) are applied to the matching portion of the IC layout to form the corrected photomask layout. This action application process can be performed serially (i.e., after each match, the corresponding action is performed) in batch mode (i.e., all shapes are matched, after which all actions are applied), or in any desired combination of the two.

The shape matching, or "scanning", operation can be performed in any number of sequences. In an embodiment of the invention, the scanning operation can be performed in order of decreasing shape complexity, where no feature in the IC layout can be modified more than once. In another embodiment of the invention, scanning can be performed in order of increasing complexity, where the most complex shape matching/layout modification is performed last. In an alternative embodiment of the invention, the order of scanning can be set by the user as desired.

According to an aspect of the invention, resolution logic may be provided to resolve shape and action conflicts. In an embodiment of the invention, the resolution logic comprises a first-shape/action-controls methodology, which can be implemented through an edge-marking technique. According to another aspect of the invention, the resolution logic comprises a set of resolution rules that mandate a desired outcome when any conflict arises.

According to an aspect of the invention, the catalog of shapes and the library of layout processing actions may be provided by the system as a default. In another embodiment of the invention, the library of shape-based rules can be modified in part or created in whole by the user. According to another aspect of the invention, the shapes and actions may be received from a remote source such as a remote server.

In an embodiment of the invention, the bias table can also include single-edge "filler shapes" that provide default layout modification for portions of the IC layout not covered by the multi-edge shapes. In another embodiment of the invention, the bias table can include both rule-based OPC actions and model-based OPC actions.

The invention will be more fully understood in view of the following description and drawings.

BRIEF DESCRIPTION OF THE DRAWINGS

FIG. 2e illustrates an IC layout feature similar to the IC layout feature of FIG. 2a;

FIGS. 5a, 5b, and 5c illustrate sample IC layout features including prior OPC modifications;

FIG. 5d illustrates a desired mask layout feature to be created from the features in FIGS. 5a, 5b, and 5c;

FIG. 6c illustrates an example of a shape-based modification for PSM;

FIG. 6d illustrates an example of a branching IC layout feature;

FIG. 6e illustrates an example of nesting IC layout features;

DETAILED DESCRIPTION

An embodiment of the invention provides a system and method for applying layout processing to an IC layout using a shape-based approach. The shape-based approach advantageously enables accurate and efficient application of layout modifications.

Figure 1A:
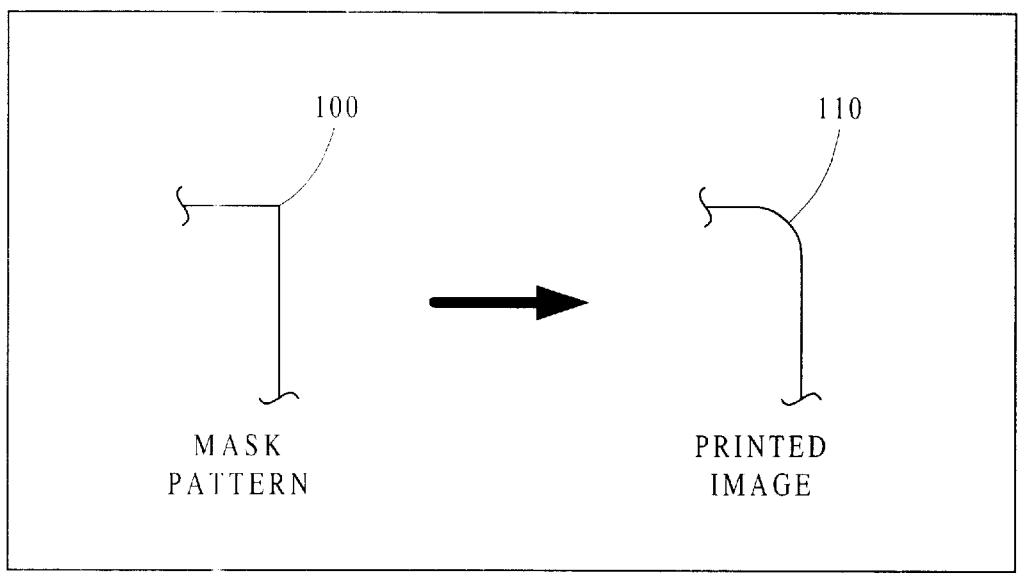
FIG. 1a illustrates a portion of a photomask pattern and the resulting printed image without OPC.
Figure 1B:
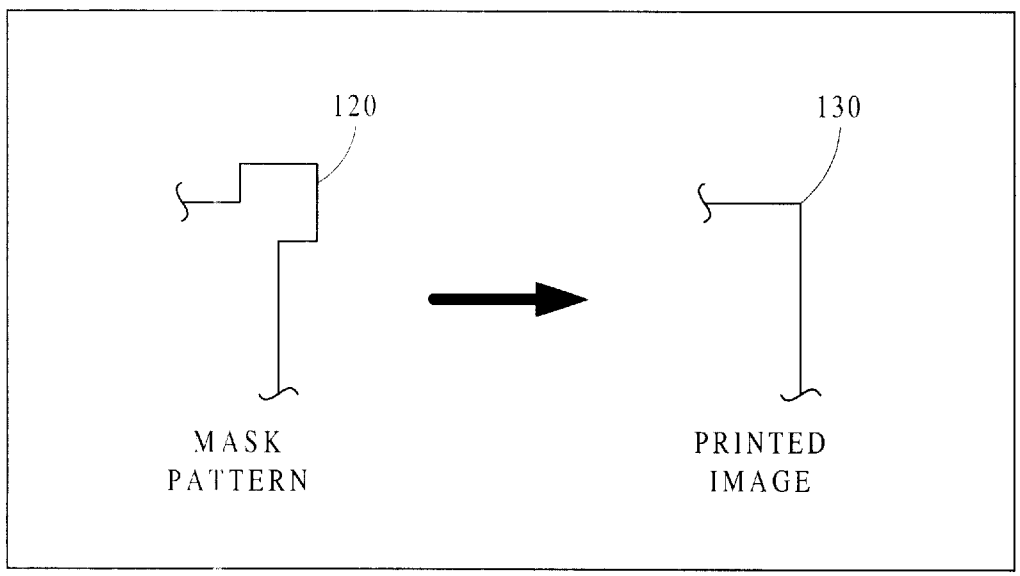
FIG. 1b illustrates a portion of a photomask pattern with OPC and the resulting printed image.
Figure 2A:
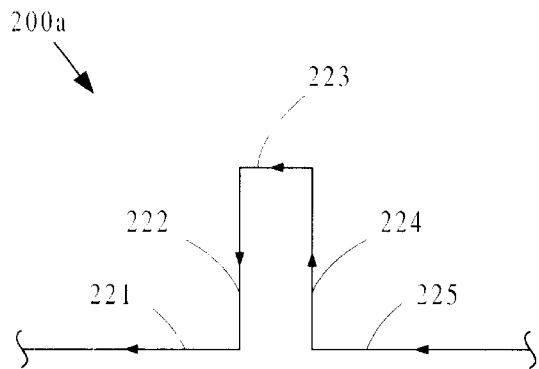
FIG. 2a illustrates an IC layout feature, showing edge directions and vertices.
Figure 2B:
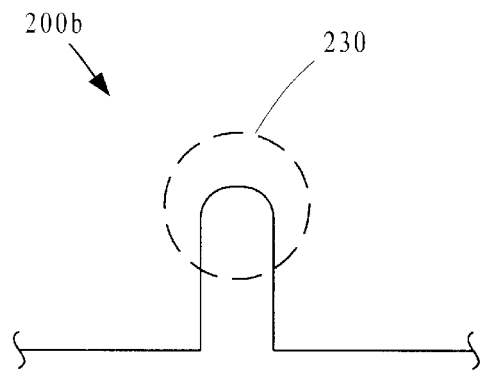
FIG. 2b illustrates a printed image of the IC layout feature of FIG. 2a without OPC.
Figure 2C:
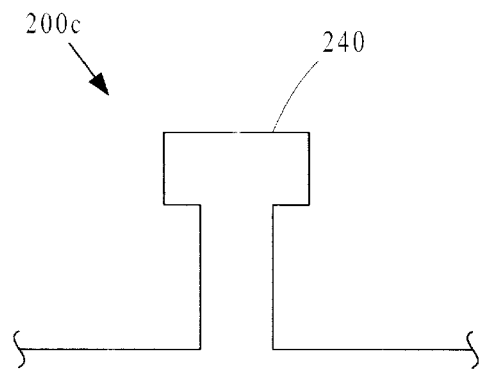
FIG. 2c illustrates a photomask layout feature of the IC layout feature of FIG. 2a after OPC modification.
Figure 2D:
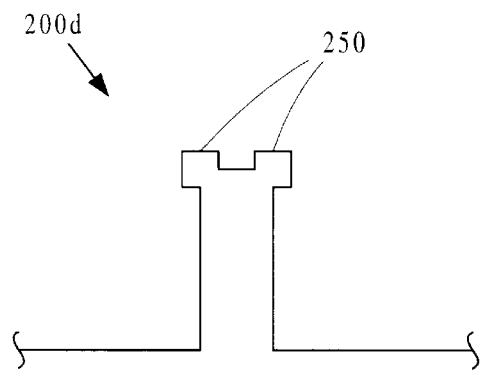
FIG. 2d illustrates a photomask layout feature of the IC layout feature of FIG. 2a after an alternative OPC modification.
Figure 2E:
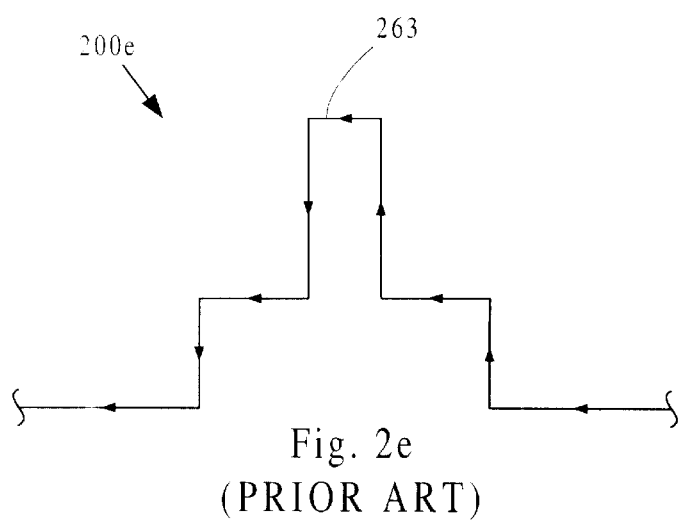
Figure 3A:
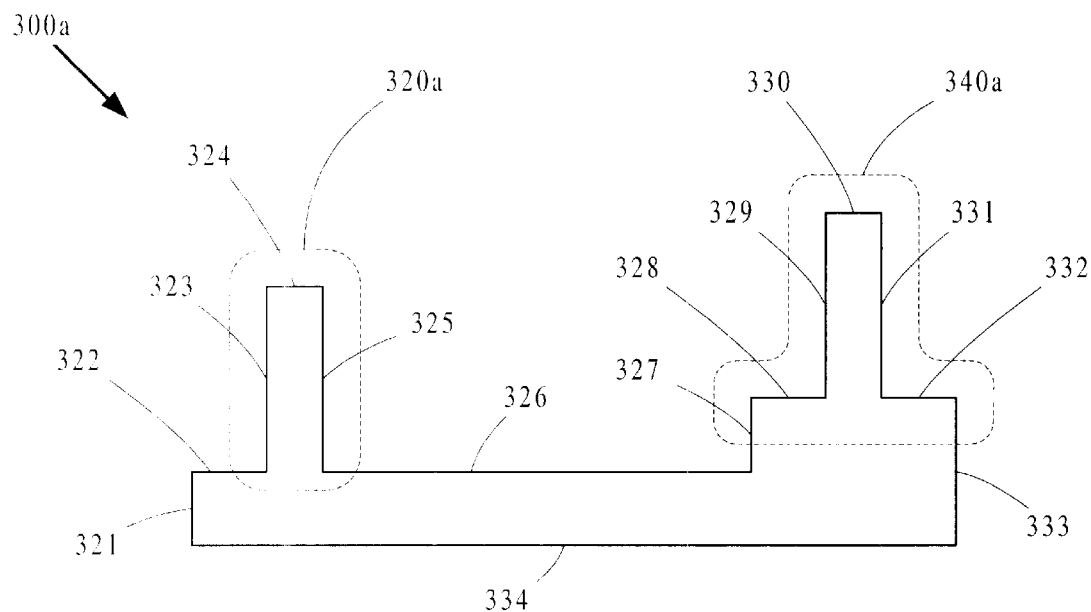
FIG. 3a illustrates a portion of an IC layout including two distinct features.

FIG. 3a shows a sample IC layout element 300a from a larger IC layout (not shown). The outline of element 300a has been selected for explanatory purposes only. The invention may be applied to any configuration of edges in an IC layout. Element 300a comprises a series of contiguous edges 321–334. Element 300a includes a feature 320a, comprising edges 323–325, and a feature 340a, comprising edges 328–332. Edges 329–331 in feature 340a form a grouping substantially similar in size and configuration to feature 320a. In a conventional rule-based OPC system, the same biases would probably be applied to both features 320a and 330a. This would be problematic if different biases were desired for the two features. In contrast, a shape-based OPC system in accordance with an embodiment of the invention could apply different bias features to the photomask layout for features 320a and 340a.

Figure 3B:
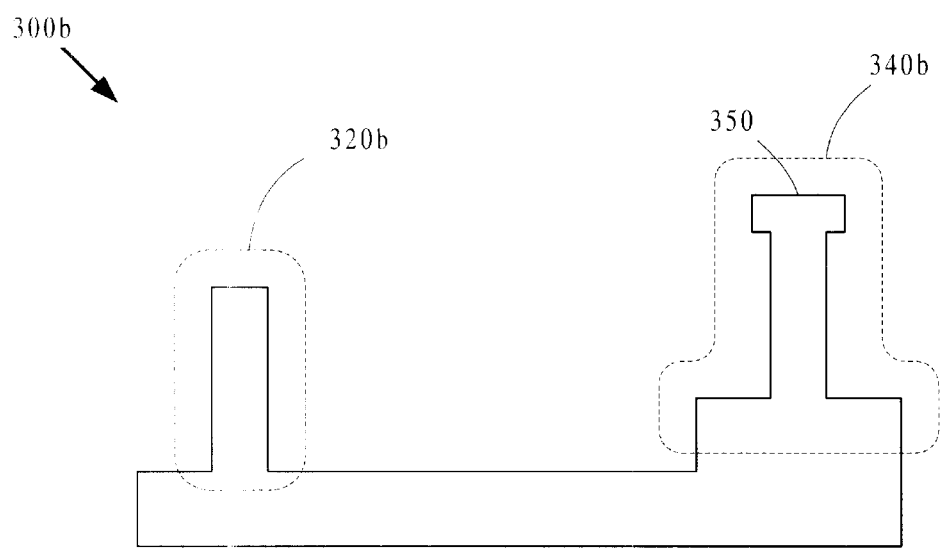
FIG. 3b illustrates a portion of a photomask layout of the IC layout of FIG. 3a after selective OPC application.

FIG. 3b shows an example of a photomask layout element 300b that could correspond to IC layout element 300a shown in FIG. 3a. Photomask layout element 300b includes features 320b and 340b that correspond to features 320a and 340a, respectively, in FIG. 3a. As shown in FIG. 3b, feature 320b includes no OPC modifications, but feature 340b includes a bias feature 350 (hammerhead). As described previously, such differentiation may be desirable depending on the requirements of the final printed layout. The invention enables this type of discrimination between IC layout features by employing a "shape-based" rule set to create the final photomask layout.

Shape Definition

In accordance with embodiments of the invention, a catalog of "shapes" can be established, based on groupings of associated edges. Each shape represents a type of feature (or range of features) that may be present in an IC layout. Each individual shape within the catalog can be defined by the properties associated with its grouping of edges. Table 2 lists a number of sample properties in accordance with an embodiment of the invention. The listing in Table 2 is intended to be explanatory rather than comprehensive. Other properties will become readily apparent to those of ordinary skill in the art.

TABLE 2

Partial Listing of Shape Properties

| | | |
|---|---|---|
| Spacing | Min. Spacing | Length |
| Inner Color | Outer Color | Height |
| Width | Neighbor Width | Min. Width |
| Inner Distance | Min. Inner Distance | Continuity |
| Outer Distance | Min. Outer Distance | Min. Continuity |
| Radial Spacing | Min. Radial Spacing | Angle |

Figures 4A, 4B, 4C:
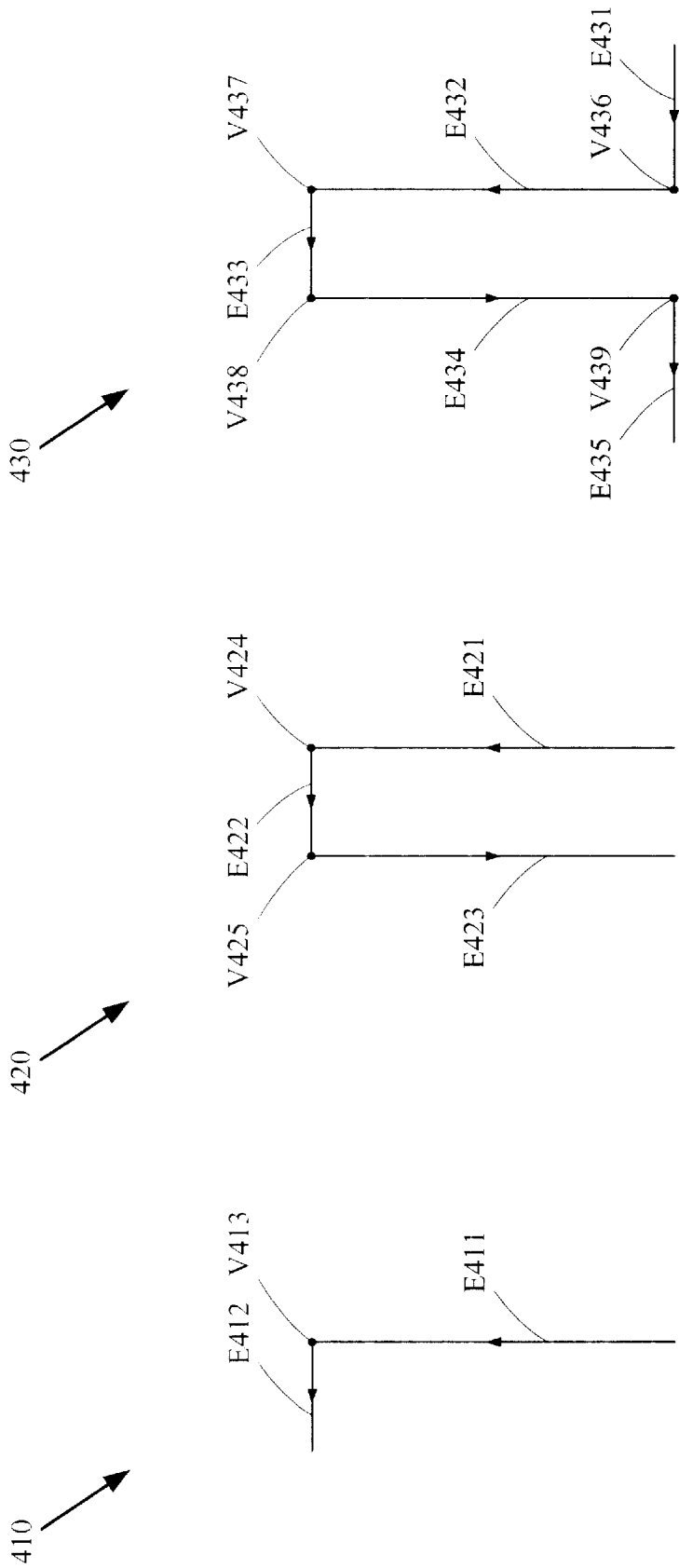
FIGS. 4a, 4b, and 4c illustrate sample shapes in a shape-based rule library of the invention.

FIGS. 4a–4c provide examples of basic shapes according to aspects of the invention. FIG. 4a shows a shape 410 comprising an edge E411 and an edge E412 forming a corner at a vertex V413. FIG. 4b shows a shape 420 comprising an edge E421 joined at a vertex V424 to an edge E422, which in turn is joined at a vertex V425 to an edge E423. Finally, FIG. 4c shows a shape 430 that comprises contiguous edges E431–E435, which are joined at vertices V436–V439, respectively.

Although geometrically simple, shapes 410, 420, and 430 can present problems for conventional OPC systems. Edge-based systems can have difficulty differentiating edges E412, E422, and E433 in FIGS. 4a, 4b, and 4c, respectively, since the edges "look" similar in each configuration. In contrast, the shape-based approach of the invention allows each different implementation to be selected without confusion.

In addition to enabling more effective differentiation between simple yet similar features, a shape-based approach in accordance with an aspect of the invention also enables efficient identification of complex features. For example, an IC layout may have existing (inadequate) OPC modifications that can be replaced with more accurate/appropriate corrections. IC layout features 510 (including a hammerhead bias feature 511), 520 (including a "fuzzy hammerhead" bias feature 521), and 530 (including a "diamond hammerhead" bias feature 531), shown in FIGS. 5a, 5b, and 5c, respectively, could represent unsuccessful OPC modifications to a finger feature. A photomask feature 540 having a hammerhead feature 541 shown in FIG. 5d might represent the desired configuration after proper OPC modification. If the original IC layout is no longer available, it would be desirable to perform OPC on the existing (modified) feature.

A conventional edge-based OPC system would have difficulty identifying features 510, 520, or 530 as having been previously modified, and so might try to apply corrections on top of original bias features 511, 521, and 531, respectively, rather than replacing them with hammerhead feature 541. In contrast, a shape-based system in accordance with the invention could define a shape having the same configuration as feature 510, 520, or 530, thereby enabling straightforward detection of the prior OPC modifications.

Figure 6A:
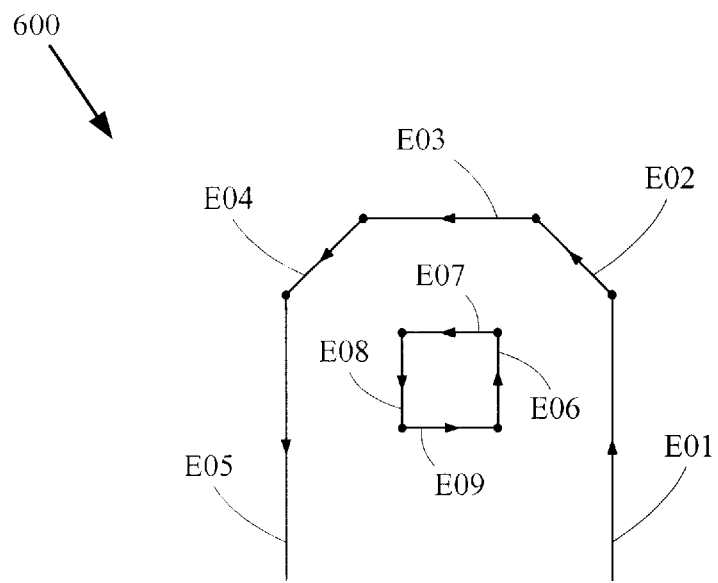
FIG. 6a illustrates an example of a shape comprising non-contiguous edges.

According to another aspect of the invention, a shape may include non-contiguous edges. For example, FIG. 6a shows a shape 600 comprising edges E01–E09. Edges E01–E05 are contiguous, forming a "tombstone" feature that is physically disconnected from contiguous edges E06–E09. The use of only contiguous edges E01–E05 to define a shape, would require the formulation of additional rules to detect the presence of a feature like that formed by edges E06–E09 within the shape. In addition to the difficulties associated with this rule generation, the additional rules would also consume greater processing resources, since each feature matching a shape formed by edges E01–E05 would have to be checked for the presence of an interior feature. These problems could be avoided through the use of shape 600, which already includes the proper interior elements, thereby enabling direct identification of only the desired features.

Figure 6B:
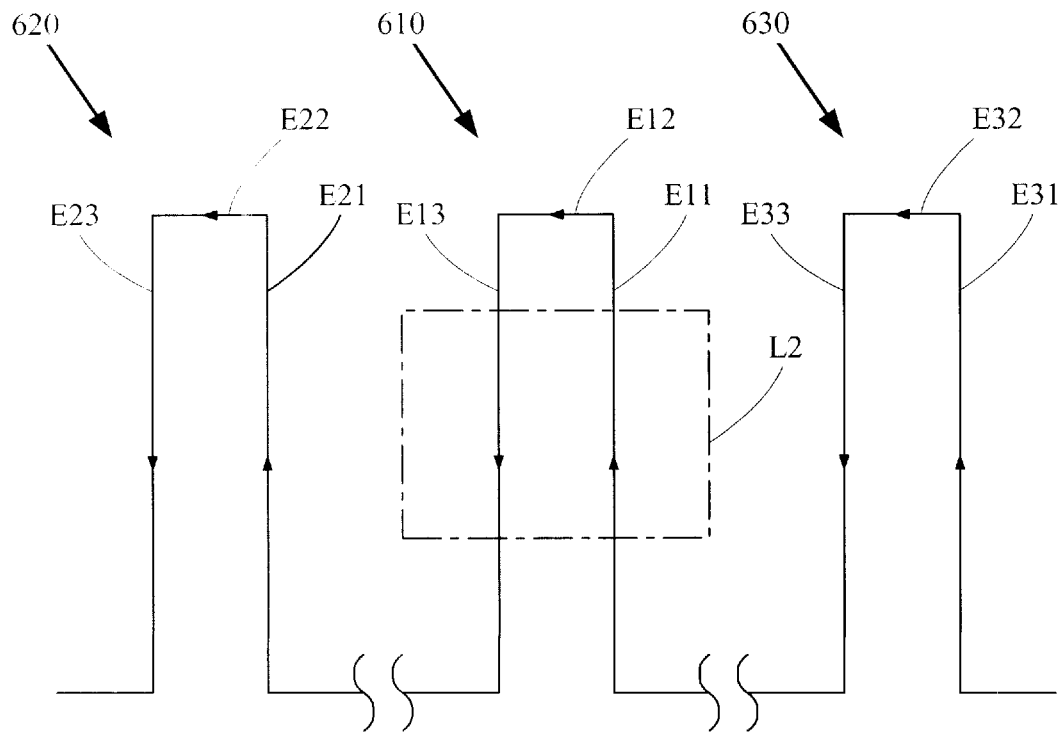
FIG. 6b illustrates an example of multi-layer IC layout features.

According to another aspect of the invention, a shape may include edges from different layers of an IC layout, where each layer represents a different process step in the manufacture of the IC. FIG. 6b shows IC layout features 610, 620, and 630, which are part of a single layer in a larger IC layout (not shown). Feature 610 comprises contiguous edges E11, E12, and E13, feature 620 comprises contiguous edges E21, E22, and E23, and feature 630 comprises contiguous edges E31, E32, and E33. Features 610, 620, and 630 are all similarly sized. However, only feature 610 is positioned over a feature L2, which is part of a different layer (not shown) of the IC layout.

Feature L2 might, for example, represent a diffusion region, thereby indicating that feature 610 is to be used to form a transistor gate. As a critical device component, the printed image corresponding to feature 610 probably demands much greater accuracy than the printed images corresponding to features 620 and 630. Therefore, a shape may be defined that includes edges E11–E13 of feature 610, and also includes edges (or all) of feature L2. By defining a shape in this manner, critical features such as feature 610 can be readily distinguished from less critical features such as features 620 and 630.

FIG. 6c shows a layout transistor feature 650 comprising a source region 651(*a*), a drain region 651(*b*), a gate region 652, and an interconnect region 653. Source region 651(*a*) comprises edges 654–659. PSM techniques may be used to provide accurate resolution of transistor feature 650. For example, by assigning different phases to regions 651(*a*) and 651(*b*), the accuracy of gate region 652 can be enhanced. However, an OPC feature such as a gate serif 660 may be required to maintain the accuracy of region 651(*a*) where it is not bounded by region 651(*b*). By defining a shape that includes edges 656–658, gate serifs can be added to all IC layout features similar to region 651(*a*).

FIG. 6d shows a branching shape 660 comprising edges 661–673 comprising multiple extremities. This type of branching arrangement would be difficult to identify using conventional edge-based identification, due to the angular relationships of the edges and the multiple arms. However, by defining the entire collection of edges as a single shape, matching IC layout features can be readily identified. IC layout features with any number of branches can be identified in a similar fashion.

FIG. 6e shows a shape 680 comprising contiguous edges 681–683 and contiguous edges 684–688. Edges 681–683 form a finger feature that is "nested" in a pocket formation created by edges 684–688. Edges 681–683 and edges 684–688 may be portions of two different features, but by defining a shape using edges 681–688, all portions of an IC layout matching the configuration shown in FIG. 6e can be quickly identified.

Figure 7C:
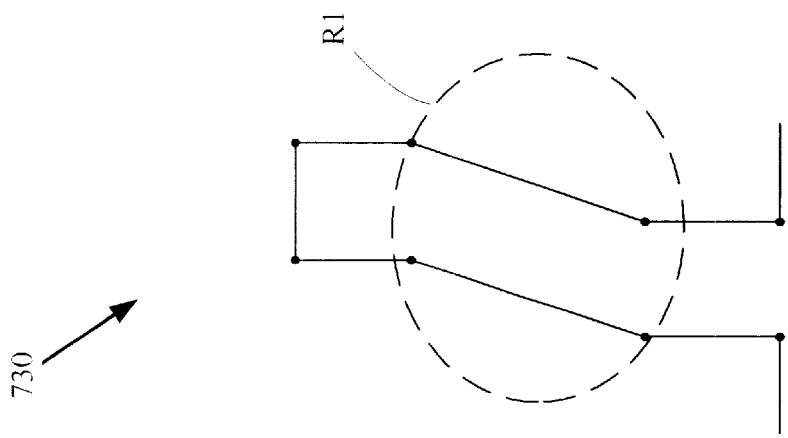
FIGS. 7a–7c illustrate IC layout features that differ from each other only in certain regions.
Figure 7B:
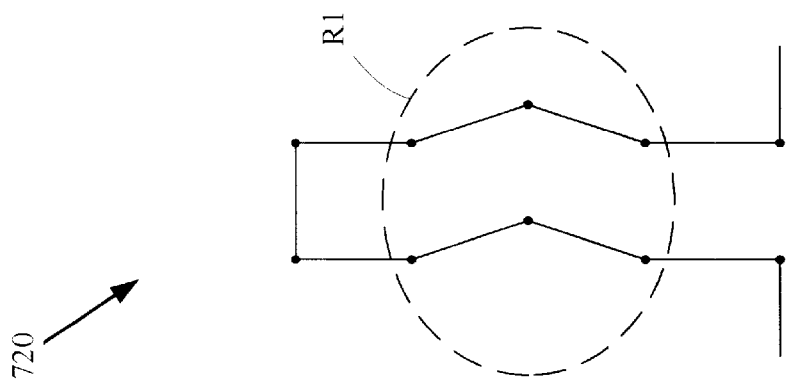
Figure 7A:
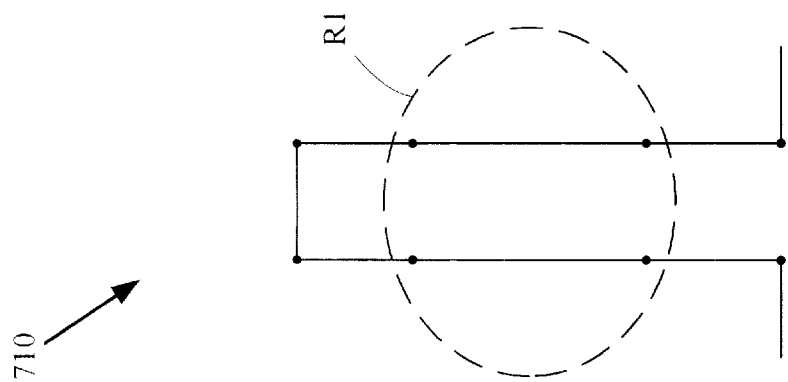
Figure 7D:
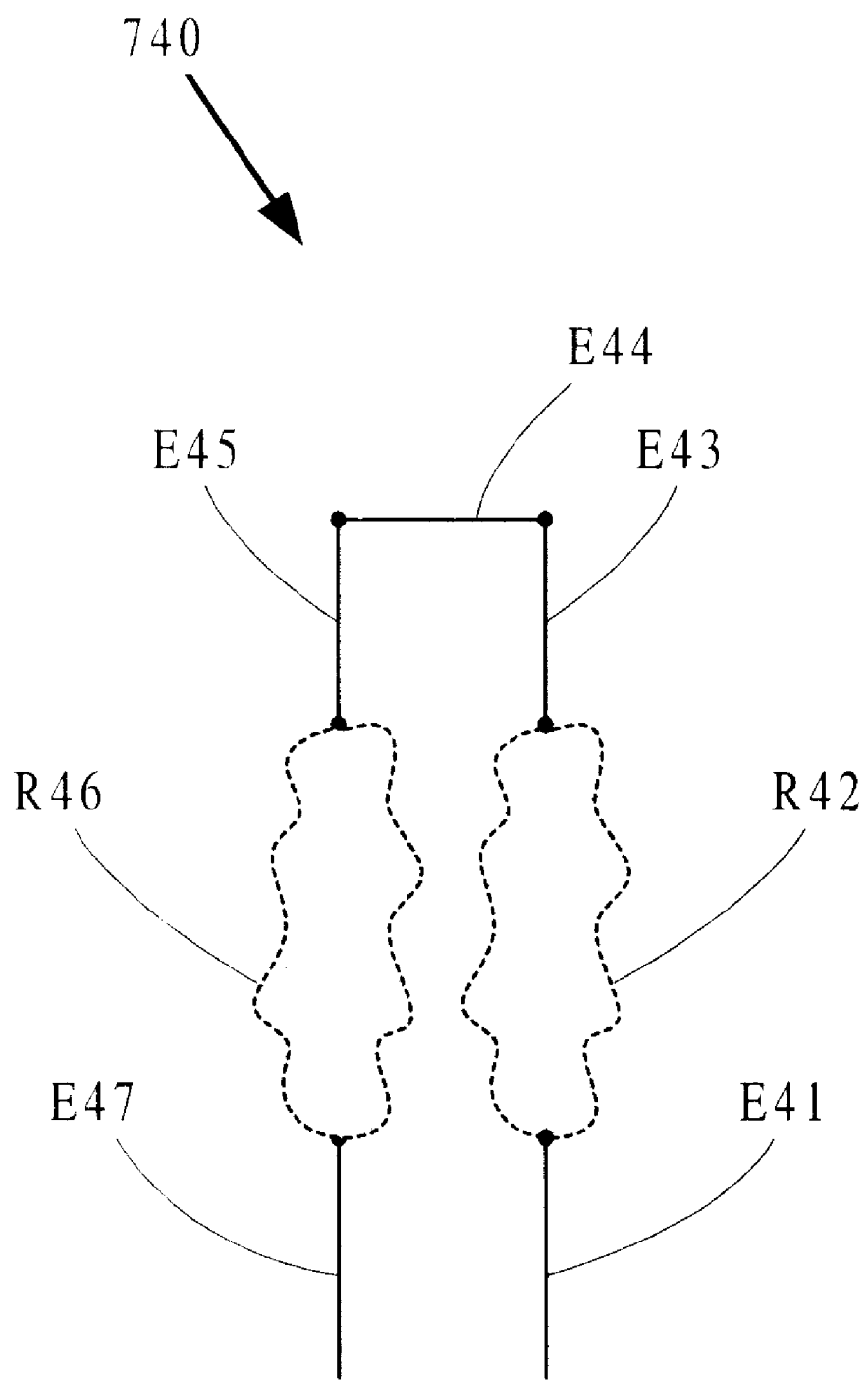
FIG. 7d illustrates a shape having an indeterminate section that provides wildcard functionality.

FIGS. 7a, 7b, and 7c show layout features 710, 720, and 730, respectively. Features 710, 720, and 730 significantly differ only in indicated regions R10, R20, and R30, respectively. Therefore, one shape with a "wildcard" functionality could be used to identify all of features 710, 720, and 730. Specifically, in accordance with another aspect of the invention, portions of the group of edges making up a shape may be left indeterminate. This provides a "wildcard" functionality that allows the shape to identify a range of actual layout features. For example, FIG. 7d shows a shape 740 comprising edges E41, E43–E45, and E47, and indeterminate regions R42 and R46. Edges E43–E45 are contiguous, while edges E41 and E43 are coupled by indeterminate region R42, and edges E45 and E47 are coupled by indeterminate region R46. Indeterminate region R42 may be defined as any linkage between edges E41 and E43. Similarly, region R46 may be defined as any linkage between edges E45 and E47. Indeterminate regions R42 and R46 therefore allow shape 740 to match any layout feature having edges E41, E43–E45, and E47, regardless of how those edges are coupled. Additional limitations on the regions as a whole (length, width, number of included edges, etc.) and on individual edges within the regions (length, color, orientation, etc.) may be imposed to restrict the potential coverage of shape 740.

Shape Matching and Action Application

Once the catalog of shapes is specified, "actions" may be formulated as functions of the property variables of those shapes, such as those listed in Table 2. Actions may consist of instructions to perform a modification (such as in rule-based OPC), instructions to perform a simulation (such as in model-based OPC), or any other response (e.g., checking for design rule violations, generating phase shifted regions, fracturing polygons for e-beam patterning, etc.) to a particular set of parameters. Therefore, a shape-based system in accordance with an aspect of the invention may be used in any situation requiring improved identification of layout features.

Figure 12:
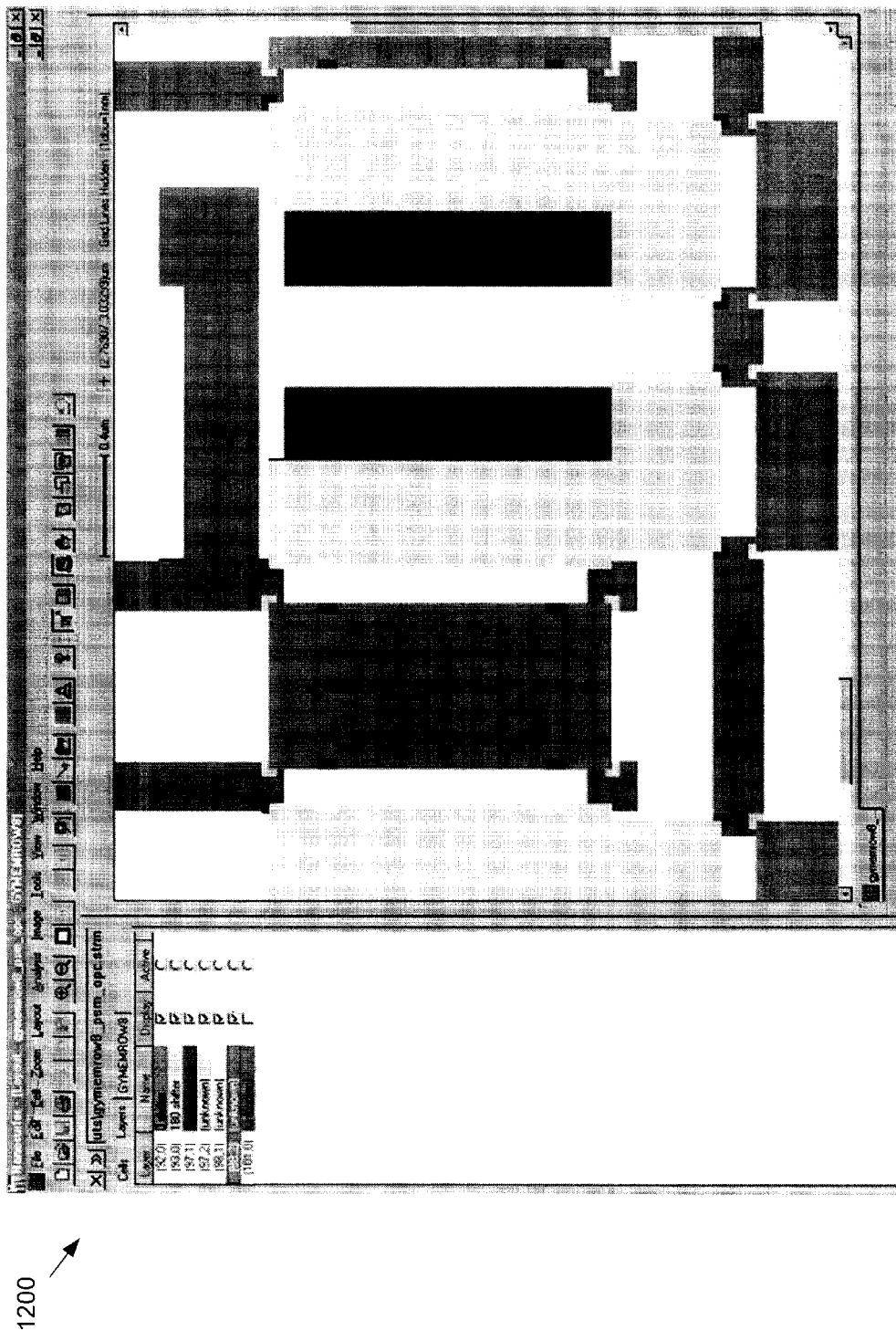
FIG. 12 shows a sample graphical user interface for defining shapes and actions.

In an embodiment of the invention, a layout modification system includes a bias table capturing a set of actions based on a catalog of shapes. The shapes/actions may be provided as defaults by the system, or the user may add or modify shapes/actions as desired. In an embodiment of the invention, a graphical user interface (GUI) can be provided to allow the user to input custom shapes and define actions. A sample GUI 1200 in accordance with an aspect of the invention is shown in FIG. 12. GUI 1200 allows a user to define PSM and OPC actions to be applied upon detection of particular shapes. The particular menu displayed in GUI 1200 allows the user to apply different phases to features in various layers of the IC layout. In another embodiment of the invention, a predetermined shape/action file may be loaded from an external source to provide the desired shape/action definitions.

Table 3 is a bias table that includes sample actions for shapes 420 and 430, from FIGS. 4b and 4c, respectively. Additional information related to proper placement and sizing of the resultant bias features is not shown for simplicity. Such information could also be included in the bias table or be made accessible to the bias table.

TABLE 3

Shape-Based Bias Table

| SHAPE | E3 ($\mu$m) | E2, E4 ($\mu$m) | E1, E5 ($\mu$m) | V2, V3 (deg.) | V1, V4 (deg.) | Beg/ End (deg.) | BIAS |
|---|---|---|---|---|---|---|---|
| 430 | <0.25 | >1.5 | <1.0 | 90 ± 5 | 270 ± 5 | 90 ± 5 | Hammer head |
| 420 | <0.5 | <3.0 | — | 90 ± 5 | 270 ± 5 | — | None |

Table 3 includes rules that could be applied to IC layout element 300a (FIG. 3a) to produce photomask element 300b (FIG. 3b). For example, if feature 340a shown in FIG. 3a matched the dimensional and angular orientations of the rule listed for shape 430 (FIG. 4c) in Table 3, a hammerhead (350) would be added to that feature (340b) in the photomask layout (element 300b). Similarly, feature 320a (FIG. 3a) might be governed by the rule for shape 420 (FIG. 4b) listed in Table 3, thereby resulting in no modification to its corresponding photomask layout feature (320b). In this manner, OPC modifications may be applied to IC layout features on a selective basis, under the control of the user.

The sample bias table shown in Table 3 includes a single action for each of shapes 420 and 430. Often, a single action will be sufficient to define the universe of required OPC modifications for a particular shape. For example, a user may decide that a hammerhead feature is to be added to any finger structure narrower than 0.25 $\mu$m and longer than 0.75 $\mu$m, and that all other finger structures are to be left unmodified. In such a case, a single action associated with 0.25 $\mu$m×0.75 $\mu$m fingers effectively defines the OPC for all fingers, since any not covered by the action are properly unmodified.

However, it may also be desirable to break the action associated with a particular shape into a plurality of actions, each of the plurality of actions being applicable to IC layout features falling within a certain range of that shape's characteristic property values (e.g., edge lengths, vertex angles, etc.). Table 4 is another bias table that is similar to the bias table of Table 3, but includes two actions for shape 420. Also note that the bias output for the second action for shape 420 is "Model". This bias output represents a situation in which a model-based determination of the OPC modification would be applied. Table 4 therefore represents a "hybrid" OPC system, in which a portion of the OPC bias application is rule-based, and a portion is model-based. Such a system allows rule-based OPC to be applied to common, simple features to minimize computation time, and allows model-based OPC to be applied to critical, complex features for enhanced performance (for example, appropriate rules may not be known for unique shapes/configurations).

TABLE 4

Hybrid OPC Bias Table

| SHAPE | E3 ($\mu$m) | E2, E4 ($\mu$m) | E1, E5 ($\mu$m) | V2, V3 (deg.) | V1, V4 (deg.) | Beg/ End (deg.) | BIAS |
|---|---|---|---|---|---|---|---|
| 430 | <0.25 | >1.5 | <1.0 | 90 ± 5 | 270 ± 5 | 90 ± 5 | Hammer head |
| 420 | <0.5 | <3.0 | — | 90 ± 5 | 270 ± 5 | — | None |
| 420 | <.5 | >3.0 | — | 90 ± 5 | 270 ± 5 | — | Model |

Figure 8:
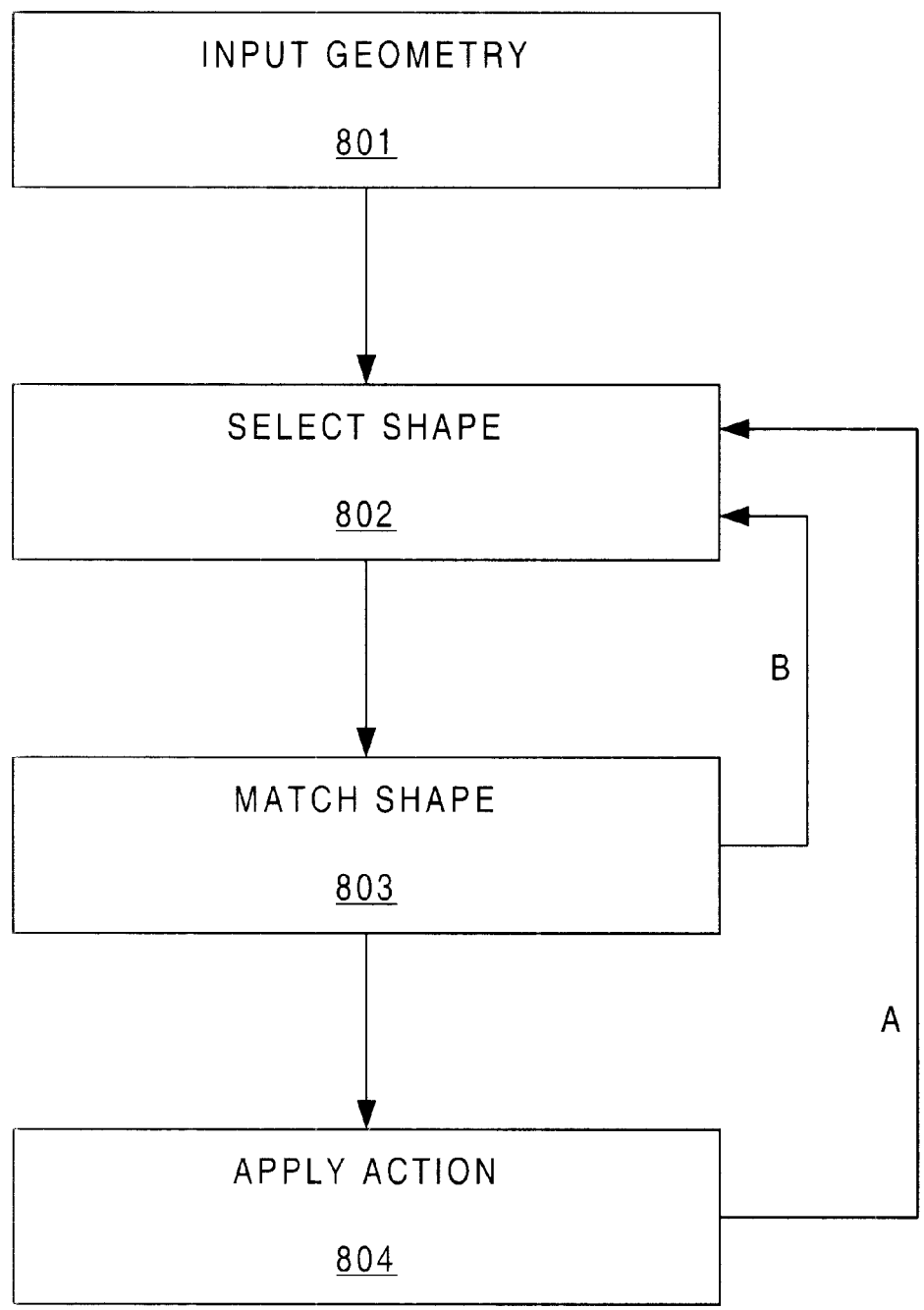
FIG. 8 shows a flow diagram of a basic shape match/action application process.

Once the actions have been defined, they may be applied to a layout in a variety of ways. For example, the application of actions to layout features may be performed in a sequential operation. Alternatively, the action application process may be performed in a batch operation. FIG. 8 shows a flow diagram of a basic action application, describing both the sequential and batch operations. Other options for action application include parallel processing (i.e., multiple actions applied simultaneously), user control (i.e., operator controls the application of actions through such methods as defining a preset process, interactively selecting actions, selecting a region of the layout to process, etc.), and any combination of the aforementioned techniques.

In the flow diagram of FIG. 8, a layout geometry to be scanned enters at block 801. A first shape from a shape catalog is then selected at block 802. Next, the first shape is compared to the layout geometry in block 803. At this point, if a batch action operation is being performed, loop B is followed and a second shape from the shape catalog is selected in block 802. The second shape is compared to the layout geometry at block 803. The process continues looping until the catalog of shapes has been completely processed, at which point the layout geometry is passed to block 804, and appropriate actions are applied to all the matched layout features. The actions are thus applied in an all-at-once (i.e., batch) manner to the layout geometry.

However, if a sequential action operation is being performed, after the first shape is compared at block 803, the layout geometry is passed to block 804, where the action associated with the first shape is applied to the matching layout features. Loop A is then followed and a second shape is selected from the shape catalog at block 802. After a second match operation in block 803, the action associated with the second shape is applied to the layout geometry in block 804. This looping continues until every shape has been compared to the layout geometry and each action has been applied.

Regardless of whether a batch or sequential action application process is used, some mechanism may be provided to deal with conflicts that occur during the process. In lithography-related applications, there are two main types of conflicts—shape conflicts and action conflicts. A shape conflict occurs when different shapes match overlapping portions of features in an IC layout. An action conflict occurs when inconsistent or conflicting actions are to be applied an IC layout. Action conflicts may arise as a result of shape conflicts (e.g., the actions associated with overlapping shapes themselves interact) but can also arise from features that are in close proximity with one another.

Figure 9A:
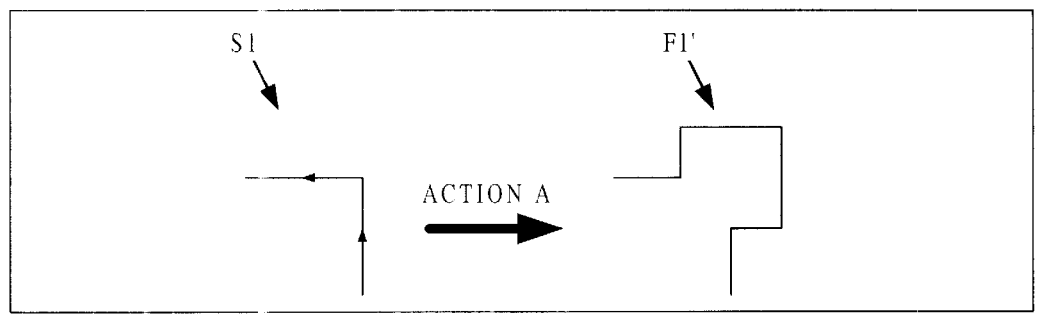
FIGS. 9a and 9b illustrate sample shapes and their associated actions.
Figure 9B:
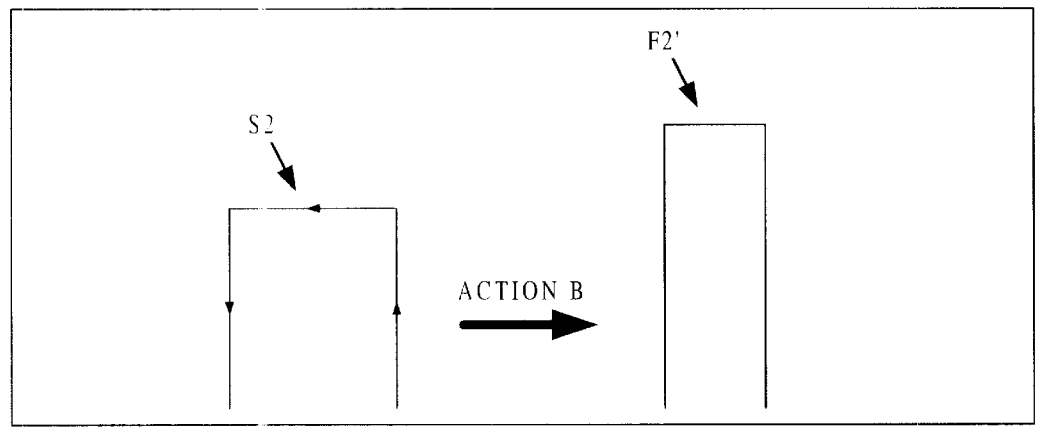
Figure 9C:
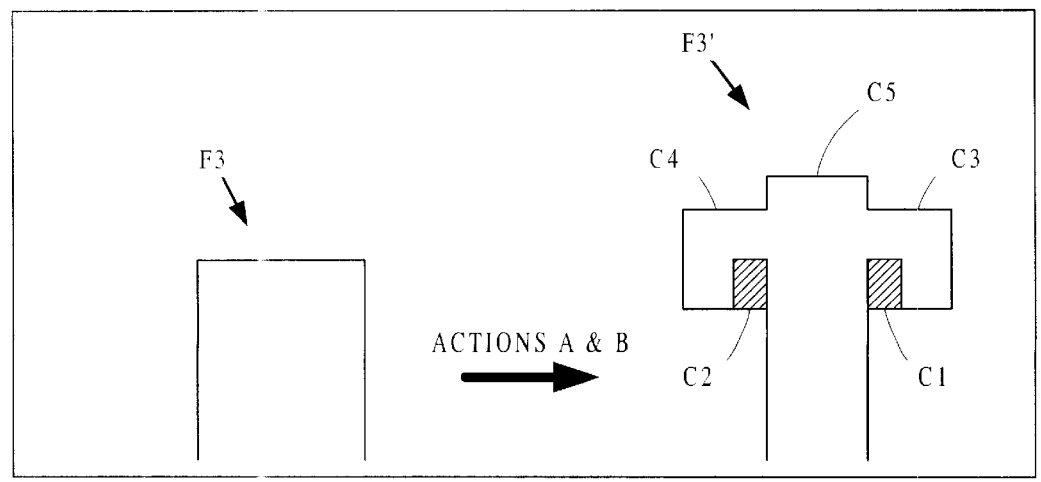
FIG. 9c illustrates a shape and action conflict.

FIGS. 9a–9c provide an example to illustrate the two types of conflicts. FIG. 9a shows a shape S1 and a modified feature F1' that could result from application of an action A associated with shape S1, i.e., action A applies a serif to corners matching shape S1. FIG. 9b shows a shape S2 and a modified feature F2' that could result from application of an action B associated with shape S2, i.e., action B narrows and lengthens finger structures matching shape S2.

Because both shapes S1 and S2 can match the same feature, shape conflicts between the two shapes are likely. For example, FIG. 9c depicts an original layout feature F3 that might cause a shape conflict between shapes S1 and S2. Shape S1 could match the corners of feature F3, while shape S2 could match the entire feature. This overlap of shapes is not inherently problematic, but because OPC actions are typically intended to be applied in isolation from other actions, this type of shape overlap can cause unexpected and undesirable action interactions (i.e., action conflicts).

Modified layout feature F3', shown in FIG. 9c, indicates a possible outcome of an action conflict originating in a shape conflict. The cross-like shape of feature F3' is produced as the serifs from action A physically overlap with the extended region generated by action B. Feature F3' is unlikely to produce the results expected from action A or action B. Further incompatibility of actions A and B is also evidenced at underlap regions C1 and C2, where the narrowing caused by action B "pulls" the body of the feature away from the serifs of action A.

Therefore, conflict resolution logic can be included to deal with both shape and action conflicts in some embodiments. In an embodiment of the invention, potential rule conflicts (or redundant rules, rules that could be combined, etc.) can be identified to the user during the rule definition stage for resolution prior to shape scanning. In another embodiment, shape and action conflicts could be avoided through the use of "exclusion IDs". For example, at each shape match detection, the edges and/or corners of the matching layout feature could be marked with exclusion IDs. Then, match operations could perform an initial check of edges/corners marked for exclusion IDs and simply skip layout features including such marked edges. Similarly, bias features added by an OPC action could be marked with exclusion IDs, thereby selectively preventing or allowing bias application in those regions.

In accordance with another embodiment of the invention, shape and action conflicts could be avoided through the use of resolution rules. Resolution rules could determine which, if any, of the conflicting shapes/actions take priority and how such shapes/actions would be applied. The rules could perform any manner of conflict resolution desired by a user. For example, a resolution rule may simply provide that the first action always takes priority, and subsequent actions can be simply ignored (essentially the same effect as the exclusion ID method). Or, conflicting actions could be ignored but flagged for subsequent review. Alternatively, the rules could apply a completely different third action when a particular action conflict is encountered. Of course, the user could manually define which shapes/actions are to be implemented over others. The manner of operation of the resolution rules may therefore take almost any form.

The order of shape comparison may also have a significant effect on the ultimate resolution of action conflicts. For example, if the resolution rules specify that the first shape/action takes priority, it is clear that the earlier in the process a particular shape/action is applied, the greater the effect of that shape/action.

In an embodiment of the invention, shape complexity provides an ordering basis. "Complexity" refers both to the number of edges included in a shape and the precision with which the properties of that shape have been specified. A more complex shape provides greater specificity in the application of the action(s) associated with that shape. In applying the set of actions to an IC layout, one computationally efficient process could be to scan for shapes in order of decreasing complexity. This process could require that once a feature within the IC layout is matched with a shape to produce an OPC-corrected photomask layout feature, no further changes to that specific IC layout feature are allowed. Thus, this process could prevent the less complex shapes (which are theoretically capable of matching more features within the IC layout) from causing unwanted "remodification" of features to which corrections have already been applied.

Alternatively, the IC layout could be scanned for shapes in order of increasing complexity. In such a method, "remodification" could be allowed, so that the more complex shapes could provide the final modifications to the IC layout, essentially "overruling" any prior modifications by less complex shapes. However, this method could involve more computation (action applications) than the previous method.

Shape-Based OPC System

Figure 10A:
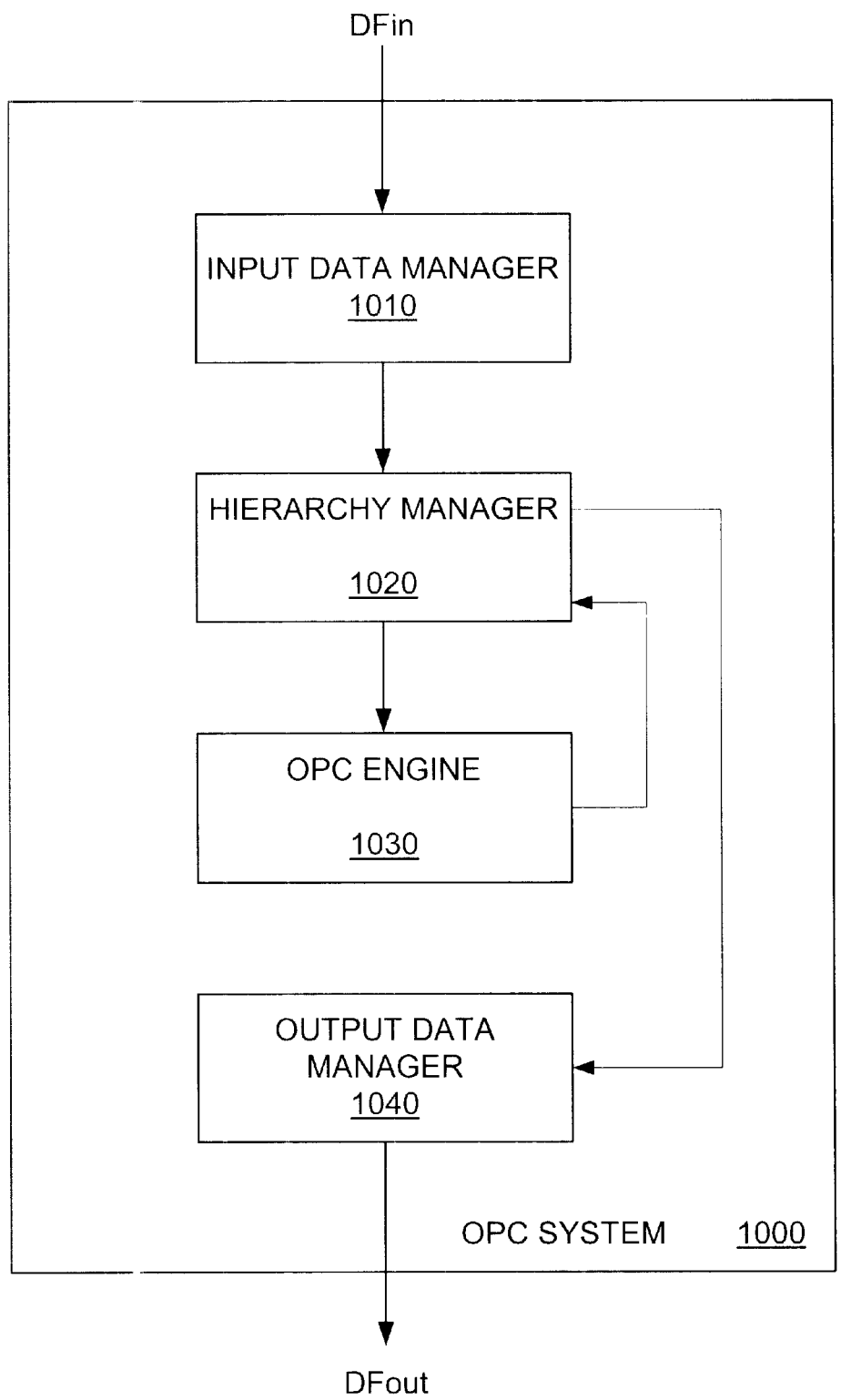
FIG. 10a illustrates a schematic diagram of a shape-based OPC system.

FIG. 10a shows a diagram of a shape-based OPC system 1000 in accordance with an embodiment of the invention. OPC system 1000 comprises an input data manager 1010, a hierarchy manager 1020, an OPC engine 103, and an output data manager 1040. Input data manager 1010 is coupled to receive an input data file DFin for a particular IC layout. According to an aspect of the invention, data file DFin may be a standard layout database file exchange format such as GDS, GDSII, DXF, CIF, IGES, a flat file, or even a proprietary database file format. However, any data file format that defines the geometry of a layout could be used.

Input data manager 1010 converts data file DFin to a form that may be manipulated and processed by the OPC system. In an embodiment of the invention, input data manager 1010 divides data file DFin into its various layers and discrete sets of geometries within each layer. For example, a single set of geometries may include an entire layer of the IC layout. Alternatively, a single set of geometries might only include a single polygon from a particular layer of the IC layout. In an aspect of the invention, a user may configure the conversion preferences of input data manager 1010. The converted data is then passed to hierarchy manager 1020. In an alternative embodiment, input data manger 1010 can be incorporated in hierarchy manager 1020.

Hierarchy manager 1020 organizes and categorizes the sets of geometries according to a predefined ordering basis (for example to minimize the amount of data required to be processed or to minimize the time required for processing). An example of a hierarchy manager is included in the CATS™ software package, from Numerical Technologies, Inc. Hierarchy manager 1020 then feeds the sets of geometries to OPC engine 1030 according to its priority structure.

Figure 10B:
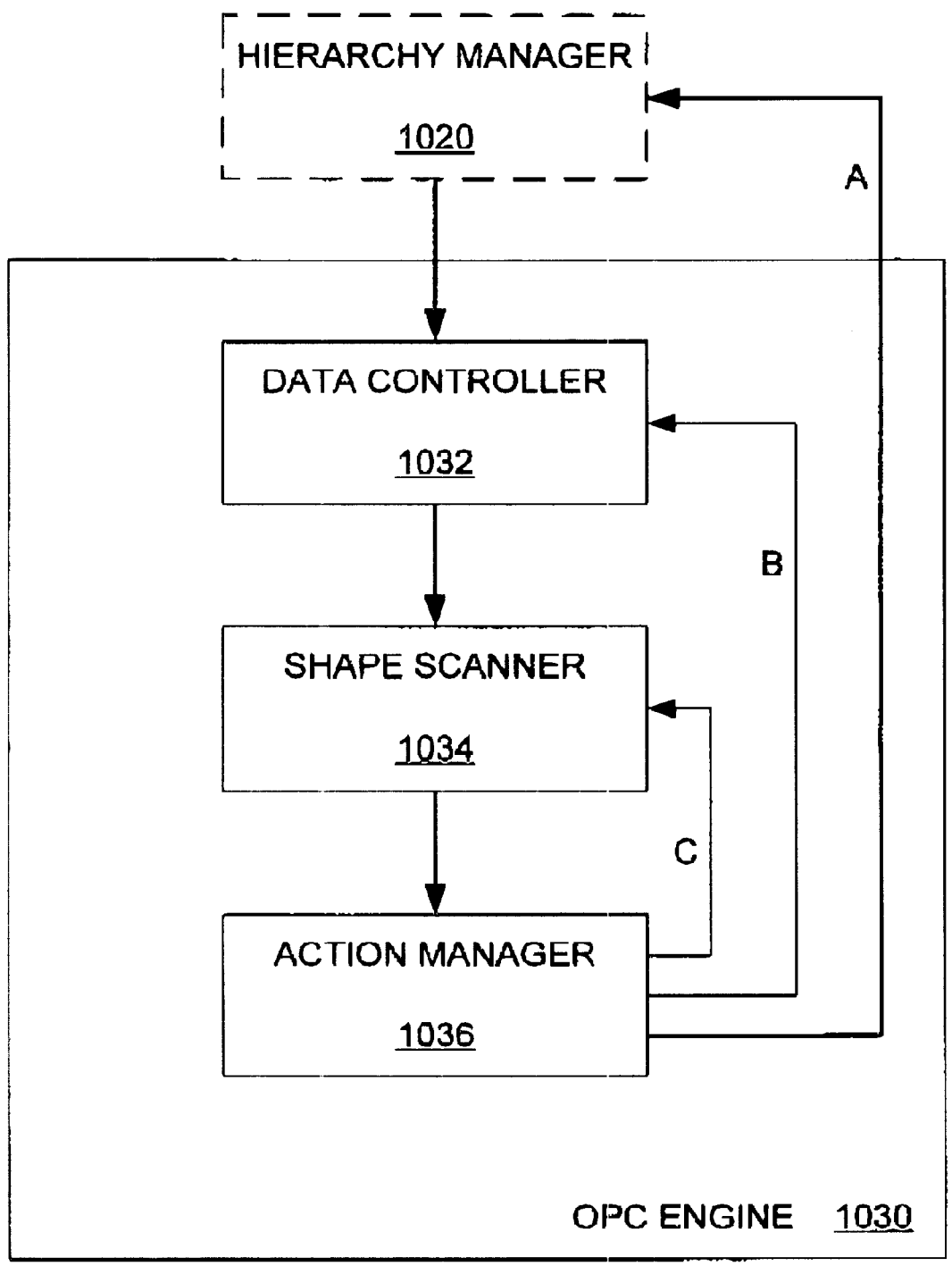
FIG. 10b illustrates a schematic diagram of an OPC engine.

OPC engine 1030 receives a set of geometries, and performs shape matching and action application to the set. An embodiment of OPC engine 1030, comprising a data controller 1032, a shape scanner 1034, and an action manager 1036, is shown in FIG. 10b. Data controller 1032 accepts a set of geometries from hierarchy manager 1020 and further segregates the data into "primitives"; i.e., elements appropriate for shape scanner 1034. In an embodiment of the invention, primitives can be polygon data. Alternatively, data controller 1032 could output trapezoid data, or any other representational format used by shape scanner 1034.

Data controller 1032 then supplies the primitives to shape scanner 1034. In an embodiment of the invention, this supply operation can be a batch operation, in which all the primitives can be provided to shape scanner 1034 in a single batch. In such an operation, after the match and action operations of shape scanner 1034 and action manager 1036, respectively, data controller 1032 receives a new set of geometries from hierarchy manager 1020 (loop A). However, in another embodiment of the invention, data controller 1032 performs a sequential supply operation, sending primitives one at a time to shape scanner 1034. After processing of each primitive by shape scanner 1034 and action manager 1036, data controller 1032 supplies a new primitive to shape scanner 1034 (loop B). This looping continues until all the elements in data controller 1032 have been processed.

Shape scanner 1034 compares the shapes within its own shape catalog to features of the primitives provided by data controller 1032, identifying any matches. Shape scanner 1034 also includes logic to resolve shape conflicts, using any of the methods described previously. Action manager 1036 then applies the appropriate actions where indicated by the matching operation of shape scanner 1034. Action manager 1036 also includes logic to resolve any action conflicts that arise. As noted with respect to the action application flow diagram of FIG. 8, the match/action operations may be performed in batch mode or sequential mode. Thus, in an embodiment of the invention, shape scanner 1034 compares its entire shape catalog to the geometry elements, identifying any matching features. The fully match-processed data is then passed to action manager 1036. In another embodiment of the invention, shape scanner 1034 passes the data to action manager 1036 after each shape comparison operation. In this manner, after each shape match is performed, the action(s) associated with that shape can be applied before performing the next shape match (loop C).

After all the sets of geometries have been processed by OPC engine 1030, they are fed by hierarchy manager 1020 to output data manager 1040, as shown in FIG. 10a. The processed data can be converted by output data manager 1040 into an output data file DFout. In an embodiment of the invention, output data file DFout can be converted to the same layout database file format as input data file DFin. In another embodiment of the invention, a user may select a file format for data file DFout.

Figure 11:
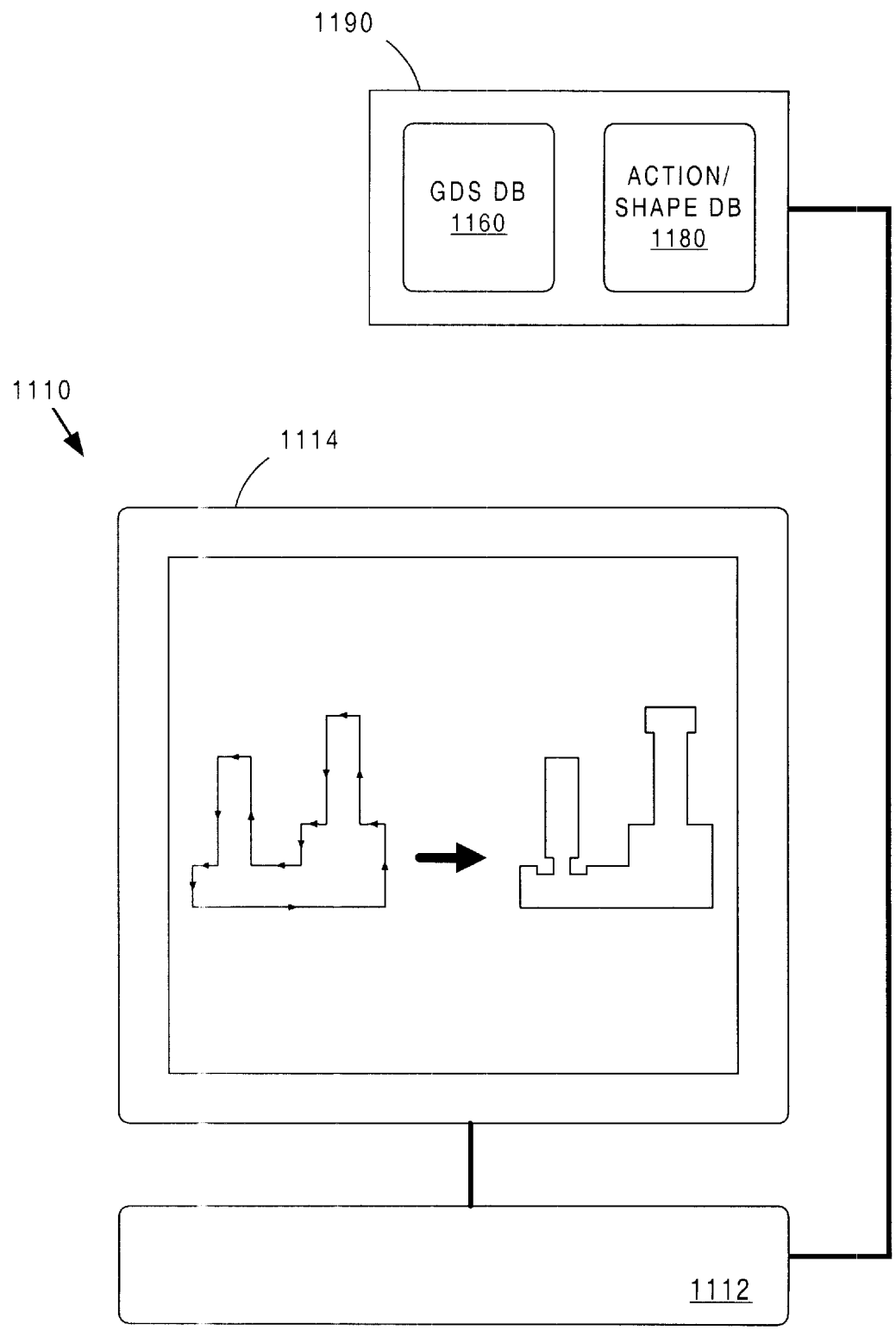
FIG. 11 illustrates an embodiment of a shape-based OPC system including access to remote action and shape databases.

FIG. 11 provides a physical representation of shape-based OPC system 1000 shown in FIG. 10a, according to an embodiment of the invention. FIG. 11 shows a computer system 1110 comprising a processor 1112 and a graphical display 1114. Alternatively, computer system 1110 could include multiple processors. Computer system 1110 includes software to perform the operations described with reference to OPC system 1000 in FIG. 10a. Computer system 1110 could include a personal computer (PC) running Microsof™ software and/or a workstation. Display 1114 allows a user to monitor and control the OPC process being performed by computer system 1110.

FIG. 11 also shows a GDS database 1160 and an action/shape database 1180, both of which may be located in a network storage location 1190 (apart from computer system 1110). GDS database 1160 stores IC layout data files, while action/shape database 1180 houses shape libraries and bias tables for use in OPC operations. Alternatively, the data files, shape libraries, and bias tables could be stored locally in computer system 1110. Computer system 1110 may access GDS database 1160 for files on which to perform OPC, and may access action/shape database 1180 for appropriate settings information for the OPC operation. In an embodiment of the invention, databases 1160 and 1180 may be accessed through a local area network (LAN). In another embodiment of the invention, databases 1160 and 1180 may be accessed though a wide area network (WAN), such as the Internet.

Thus, an efficient and powerful technique for performing IC layout processing is described. By using a shape-based identification system, seemingly similar layout features can be readily distinguished, and layout processing actions can be precisely applied. The above disclosure is not intended to be limiting. Numerous modifications and variations of the invention will be apparent to one of ordinary skill in the art. For example, a shape catalog may include default, or "filler", shapes. These filler shapes can be single edge elements used to account for any portions of the IC layout not covered by the rules associated with the multi-edge shapes. Also, the exclusion ID marking technique described as a conflict resolution technique could be used to identify problematic configurations in violation of basic design rules—in effect enabling the filtering system to perform DRC. Therefore, the invention is limited only by the following claims.

We claim:

1. A method for performing layout processing using a computer system on at least a portion of an integrated circuit (IC) layout, the IC layout comprising a plurality of layout features, the method comprising the steps of:

accessing a definition of a first shape comprising a first edge and a second edge coupled in accordance with a first plurality of properties associated with the first shape;

accessing a first action, the first action being based upon a first portion of the first plurality of properties, wherein the first action specifies the application of a first layout modification;

matching a first set of layout features with the first shape and the first portion of the first plurality of properties; and applying the first action to the first set of layout features.

2. The method of claim 1, further comprising the steps of:

accessing a second action, the second action being based upon a second portion of the first plurality of properties, wherein the second action specifies the application of a second layout modification;

matching a second set of layout features with the first shape and the second portion of the first plurality of properties; and applying the second action to the second set of layout features.

3. The method of claim 1, wherein the first shape further comprises at least one edge that is not contiguous with the first edge.

4. The method of claim 1, the IC layout being separable into a plurality of layers, wherein the first shape comprises edges from at least two of the plurality of layers.

5. The method of claim 1, wherein the shape includes one or more additional edges left indeterminate to permit matching a plurality of similar shapes.

6. The method of claim 1, further comprising the steps of:

accessing a definition of a first filler edge;

accessing a second action, the second action being based upon a second plurality of properties associated with the first filler edge, wherein the second action specifies the application of a second layout modification;

matching a second set of layout features matching the first filler edge and the second plurality of properties; and applying the second action to the second set of layout features.

7. The method of claim 1, further comprising the steps of:

accessing a definition of a second shape comprising a third edge and a fourth edge coupled in accordance with a second plurality of properties associated with the second shape;

accessing a second action, the second action being based upon a first portion of the second plurality of properties, wherein the second action specifies the application of a second layout modification;

matching a second set of layout features matching the second shape and the first portion of the second plurality of properties; and applying the second action to the second set of layout features.

8. The method of claim 7, wherein the step of applying the first action is performed after the step of applying the second action, as a result of the first shape having a greater complexity than the second shape.

9. The method of claim 7, wherein the step of applying the first action is performed before the step of applying the second action, as a result of the first shape having a greater complexity than the second shape.

10. The method of claim 7, the order of application of the first action and the second action being defined by a user.

11. The method of claim 7, the first action being based on an OPC rule and the second action being based on an OPC model.

12. The method of claim 7, wherein the steps of matching the first set of layout features and matching the second set of layout features are performed before the steps of applying the first action and applying the second action.

13. The method of claim 7, wherein the steps of matching the first set of layout features and applying the first action are performed before the steps of matching the second set of layout features and applying the second action.

14. A system for applying layout processing to an integrated circuit (IC) layout, the IC layout comprising a plurality of edges, the system comprising:

a layout processing engine including a library of layout processing actions, each of the layout processing actions being associated with one of a catalog of shapes, each of the shapes comprising at least two edges coupled in a prespecified manner, a hierarchy manager coupled to receive the IC layout, the hierarchy manager providing sets of geometries from the IC layout to the layout processing engine according to a predefined ordering basis;

a data controller coupled to receive sets of geometries from the hierarchy manager and process the sets of geometries into sets of primitives;

a shape scanner coupled to receive an input primitive from the data controller and match the catalog of shapes with the input primitive; and an action manager for applying the library of layout processing actions to portions of the input primitive matched by the shape scanner.

15. The system of claim 14, wherein at least one of the library of layout processing actions and the catalog of shapes is user-defined.

16. The system of claim 15, further comprising a graphical user interface (GUI) to modify at least one of the library of layout processing actions and the catalog of shapes.

17. The system of claim 14, wherein at least some of the library of layout processing actions and the catalog of shapes are system-generated.

18. The system of claim 17, wherein at least one of the library of layout processing actions and the catalog of shapes is user-modifiable.

19. The system of claim 17, wherein the system is coupled to receive the library of layout processing actions and the catalog of shapes from a remote source.

20. The system of claim 14, wherein each of the layout processing actions controls the application of a bias feature to the IC layout.

21. The system of claim 20, wherein the library of layout processing actions comprises a look up table (LUT).

22. The system of claim 14, wherein the shape scanner comprises shape conflict resolution logic.

23. The system of claim 22, wherein the shape conflict resolution logic applies an exclusion ID to each edge of the input primitive matched by a shape from the catalog of shapes, and wherein the shape scanner is configured to ignore edges of the input primitive marked with the exclusion ID.

24. The system of claim 22, wherein the shape conflict resolution logic generates a conflict flag if a shape conflict is detected.

25. The system of claim 22, wherein the shape conflict resolution logic selects a predefined shape if a shape conflict is detected.

26. The system of claim 14, wherein the action manager comprises action conflict resolution logic.

27. The system of claim 26, wherein the action conflict resolution logic applies an exclusion ID to each edge of the input primitive to which an layout processing action from the library of layout processing actions has been applied, and wherein the action manager is configured to ignore edges of the input primitive marked with the exclusion ID.

28. The system of claim 26, wherein the action conflict resolution logic generates a conflict flag if an action conflict is detected.

29. The system of claim 26, wherein the action conflict resolution logic performs a predetermined layout processing action if an action conflict is detected between a first layout processing action and a second layout processing action from the library of layout processing actions.

30. The system of claim 14, wherein the shape scanner compares the entire catalog of shapes with the input primitive before the action manager applies the library of layout processing actions.

31. The system of claim 30, the data controller being configured to provide a new primitive to the shape scanner after each application of the library of layout processing actions.

32. The system of claim 14, wherein after the shape scanner compares a selected shape from the catalog of shapes to the input primitive, the action manager applies the layout processing action associated with the selected shape to the input primitive.

33. The system of claim 32, the shape scanner being configured to compare a new shape from the catalog of shapes to the input primitive after the action manager applies the layout processing action associated with the selected shape.

34. The system of claim 33, the data controller being configured to provide a new primitive to the shape scanner after application of the entire library of layout processing actions to the input primitive by the action manager.

35. The system of claim 14, further comprising an input data manager for converting the IC layout into sets of geometries for the hierarchy manager.

36. The system of claim 35, further comprising an output data manager for providing an output file in a selected file format.

37. The system of claim 14, wherein the catalog of shapes comprises a first shape, the first shape comprising:

a first edge;

a second edge, the second edge being contiguous with and substantially perpendicular to the first edge;

a third edge, the third edge being contiguous with and substantially perpendicular to the second edge, wherein the third edge and the first edge are substantially adjacent.

38. The system of claim 14, wherein the library of layout processing actions comprises a first action, the first action defining the application of a hammerhead to the first shape.

39. The system of claim 14, wherein the catalog of shapes comprises a first shape, the first shape comprising:
   a first edge;
   a second edge, the second edge being contiguous with the first edge;
   a third edge, the third edge being contiguous with the second edge;
   a fourth edge, the fourth edge being contiguous with the third edge;
   a fifth edge, the fifth edge being contiguous with the fourth edge;
   a sixth edge, the sixth edge being contiguous with the fifth edge; and
   a seventh edge, the seventh edge being contiguous with the sixth edge, wherein:
      the first edge and the seventh edge are substantially parallel; and
      the second, third, fourth, fifth, and sixth edges form a substantially rectangular outline.

40. The system of claim 14, wherein the library of layout processing actions comprises a first action, the first action defining an application of a bias to a first shape.

41. The system of claim 14 wherein the catalog of shapes includes a hammerhead.

42. The system of claim 14, wherein the catalog of shapes comprises a first shape, the first shape comprising:
   a first edge;
   a second edge, the second edge being contiguous with the first edge;
   a third edge, the third edge being contiguous with the second edge;
   a fourth edge, the fourth edge being contiguous with the third edge;
   a fifth edge, the fifth edge being contiguous with the fourth edge; and
   a sixth edge, the sixth edge being contiguous with the fifth edge, wherein:
      the first edge and the sixth edge are substantially parallel;
      the first edge and the second edge form an obtuse angle;
      the fifth edge and the sixth edge form an obtuse angle; and
      the second, third, fourth, and fifth edges form a substantially diamond-shaped outline.

43. The system of claim 14, wherein the catalog of shapes includes a diamond hammerhead.

44. The system of claim 14, wherein the catalog of shapes comprises a first shape, the first shape comprising:
   a first edge;
   a second edge, the second edge being contiguous with the first edge; and
   a third edge, the third edge being contiguous with the second edge, wherein:
      the first edge and the third edge are substantially parallel; and
      the second edge forms a substantially circular contour.

45. The system of claim 14, wherein the catalog of shapes includes a circular hammerhead.

46. The system of claim 14, wherein the catalog of shapes comprises a first shape, the first shape comprising:
   a first edge;
   a second edge, the second edge being contiguous with the first edge;
   a third edge, the third edge being contiguous with the second edge;
   a fourth edge, the fourth edge being contiguous with the third edge; and
   a fifth edge, the fifth edge being contiguous with the fourth edge, wherein:
      the first edge and the fifth edge are substantially parallel;
      the second edge forms an obtuse angle with the first edge;
      the third edge is substantially perpendicular to the first edge, forms an obtuse angle with the second edge, and forms an obtuse angle with the fourth edge; and
      the fourth edge forms an obtuse angle with the fifth edge.

47. The system of claim 46, wherein the first shape further comprises:
   a sixth edge;
   a seventh edge, the seventh edge being contiguous with the sixth edge;
   an eighth edge, the eighth edge being contiguous with the seventh edge; and
   a ninth edge, the ninth edge being contiguous with the eighth edge and the sixth edge, wherein:
      the sixth, seventh, eighth, and ninth edges form a substantially rectangular outline; and
      the sixth, seventh, eighth, and ninth edges are between, but not contiguous with, the first and fifth edges.

48. The system of claim 14, wherein the catalog of shapes comprises a first shape, and wherein the library of layout processing actions comprises a first action, the first action defining the addition of a phase shifter to the IC layout upon detection of the first shape.

49. The system of claim 48, wherein the a first shape is defined to match a portion of a transistor gate in an IC layout.

50. The system of claim 14, wherein the catalog of shapes comprises a first shape, the first shape comprising a collection of edges forming a substantially branching arrangement.

51. The system of claim 14, wherein wherein the catalog of shapes comprises a first shape, the first shape comprising:
   a first collection of edges, the first collection of edges forming a pocket formation; and
   a second collection of edges, the second collection of edges forming a finger feature, the finger feature being positioned within the pocket formation.

52. The system of claim 14, wherein the catalog of shapes comprises a first shape and the library of layout processing actions comprises a first action, the first action being defined to match the first shape, the first action comprising a definition of a fracturing operation.

53. A method for performing layout processing using a computer system on at least a portion of an integrated circuit (IC) layout, the IC layout comprising a plurality of layout features, the method comprising the steps of:
   accessing a definition of a first shape comprising a first edge and a second edge coupled in accordance with a first plurality of properties associated with the first shape;

accessing a first action, the first action being based upon a first portion of the first plurality of properties, wherein the first action specifies the application of a first layout modification;

matching a first set of layout features with the first shape and the first portion of the first plurality of properties;

applying the first action to the first set of layout features;

accessing a definition of a second shape comprising a third edge and a fourth edge coupled in accordance with a second plurality of properties associated with the second shape;

accessing a second action, the second action being based upon a first portion of the second plurality of properties, wherein the second action specifies the application of a second layout modification;

matching a second set of layout features matching the second shape and the first portion of the second plurality of properties;

applying the second action to the second set of layout features; and marking each matched edge with an exclusion ID, each edge marked with an exclusion ID being removed from further matching steps.

54. Computer software for performing layout processing using a computer system on at least a portion of an integrated circuit (IC) layout, the IC layout comprising a plurality of layout features, the computer software comprising:

code for accessing a definition of a first shape comprising a first edge and a second edge coupled in accordance with a first plurality of properties associated with the first shape, the first plurality of properties including a subset of:

spacing, minimum spacing, inner color, outer color, height, width, neighbor width, minimum width, inner distance, minimum inner distance, outer distance, minimum outer distance, continuity, minimum continuity, radial spacing, minimum radial spacing, beginning angle, ending angle, and directionality;

code for accessing a first action, the first action being based upon a first portion of the first plurality of properties, wherein the first action specifies the application of a first layout modification;

code for matching a first set of layout features with the first shape and the first portion of the first plurality of properties; and code for applying the first action to the first set of layout features.

* * * * *